United States Patent
Jeong

(10) Patent No.: US 11,307,709 B2
(45) Date of Patent: Apr. 19, 2022

(54) TOUCH DRIVING CIRCUIT AND TOUCH DISPLAY DEVICE FOR REDUCING NOISE OF TOUCH SENSING SIGNAL ACCORDING TO DISPLAY DRIVING

(71) Applicant: LG Display Co., Ltd., Seoul (KR)

(72) Inventor: DaeUk Jeong, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/944,708

(22) Filed: Jul. 31, 2020

(65) Prior Publication Data

US 2021/0124447 A1 Apr. 29, 2021

(30) Foreign Application Priority Data

Oct. 28, 2019 (KR) .................. 10-2019-0134261

(51) Int. Cl.
*G06F 3/041* (2006.01)
*H01L 27/32* (2006.01)
*H01L 51/52* (2006.01)
*G06F 3/044* (2006.01)

(52) U.S. Cl.
CPC ........ *G06F 3/04166* (2019.05); *G06F 3/0412* (2013.01); *G06F 3/0446* (2019.05); *H01L 27/323* (2013.01); *H01L 27/3276* (2013.01); *H01L 51/5237* (2013.01); *G06F 2203/04112* (2013.01)

(58) Field of Classification Search
CPC ............... G06F 3/0418; G06F 3/04166; G06F 3/041662
See application file for complete search history.

(56) References Cited

U.S. PATENT DOCUMENTS

2018/0239480 A1* 8/2018 Kim .................... G06F 3/04184

* cited by examiner

*Primary Examiner* — Laurence J Lee
(74) *Attorney, Agent, or Firm* — Polsinelli PC

(57) ABSTRACT

The present disclosure of the disclosure are related to a touch driving circuit and a touch display device, in a touch sensor structure performing a touch sensing based on a mutual-capacitance, as performing a touch sensing based on a self-capacitance and a touch sensing based on the mutual-capacitance, a performance of a touch sensing may be improved. Furthermore, as driving channels of X-touch electrode line of Y-touch electrode line partially in a period performing a touch sensing based on the self-capacitance, the number of channels driven in each period is reduced and a noise according to a display driving may be reduced when performing a touch sensing based on the self-capacitance.

12 Claims, 18 Drawing Sheets

FIG.14
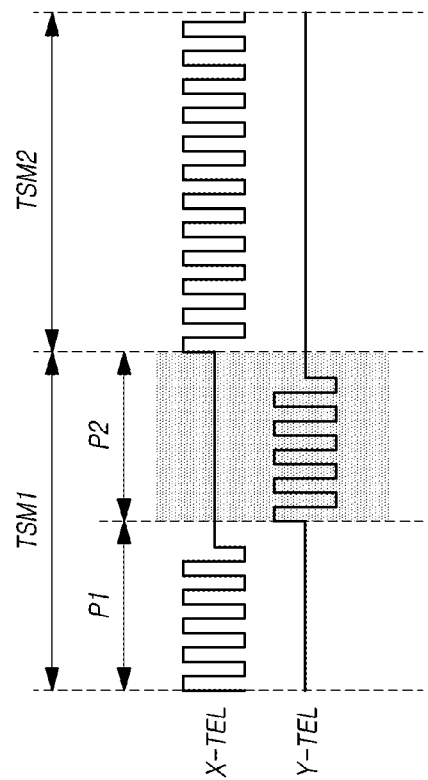
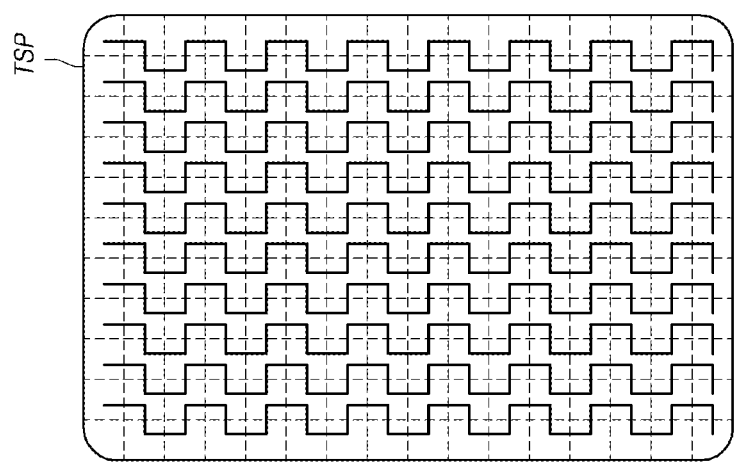

TOUCH DRIVING CIRCUIT AND TOUCH DISPLAY DEVICE FOR REDUCING NOISE OF TOUCH SENSING SIGNAL ACCORDING TO DISPLAY DRIVING

CROSS REFERENCE TO RELATED APPLICATION

This application claims priority from Korean Patent Application No. 10-2019-0134261, filed on Oct. 28, 2019, which is hereby incorporated by reference in its entirety.

BACKGROUND

Field of the Disclosure

The present disclosures relates to a touch driving circuit and a touch display device.

Description of the Background

Along with the development of the information society, demand for display devices for displaying images is increasing. In this regard, a range of display devices, such as liquid crystal display (LCD) devices and organic light-emitting diode (OLED) display devices, have come into widespread use.

A display device provides functions to recognize a touch of a user to a display panel and perform an input processing based on the recognized touch for providing more various functions to the user.

For example, the display device may comprise a plurality of touch electrodes disposed on the display panel or imbedded in the display panel. And the display device may recognize the touch of the user to the display panel to sense a change of a capacitance which is occurred by the touch of the user in a state that a touch driving signal is supplied to the touch electrode.

This display device providing a function of recognizing the touch may comprise a signal line and an electrode or the like which a signal, a voltage or the like for a display driving are supplied.

A parasitic capacitance can be formed between the touch electrode which the touch driving signal is supplied and the signal line which the signal for the display driving is supplied. And a noise of a touch sensing signal may be occurred by the parasitic capacitance, there exists a problem that a performance of the touch sensing which is performed during a display driving period may be declined.

SUMMARY

Accordingly, the present disclosure provides a touch sensing method capable of improving a sensing accuracy while enhancing a sensitivity of the touch sensing in a display device being capable of recognizing a touch.

The present disclosure provides a touch sensing method for reducing a noise of a touch sensing signal by a display driving in a sensing period for enhancing a sensitivity of a touch sensing.

According to various the present disclosure of the disclosure, a touch display device comprises a panel on which a plurality of gate lines, a plurality of data lines and a plurality of subpixels are disposed, a plurality of emitting devices disposed in each of the plurality of subpixels, an encapsulation disposed on the emitting device, a plurality of touch electrode lines disposed on the encapsulation and comprising at least one touch electrode, and a touch driving circuit configured to drive the touch electrode line.

In the touch display device, the plurality of touch electrode lines may comprise a plurality of X-touch electrode lines disposed in a first direction, and a plurality of Y-touch electrode lines disposed in a second direction which is different from the first direction.

The touch driving circuit may output a touch driving signal to X-touch electrode line of a first group of the plurality of X-touch electrode lines in a first period of a first touch sensing mode, and output the touch driving signal to X-touch electrode line of a second group of the plurality of X-touch electrode lines in a second period of the first touch sensing mode.

Furthermore, the touch driving circuit may output the touch driving signal at least one Y-touch electrode line of the plurality of Y-touch electrode lines in a third period of the first touch sensing mode.

According to various the present disclosure of the disclosure, a touch display device comprises a plurality of X-touch electrode lines disposed in a first direction, a plurality of Y-touch electrode lines disposed in a second direction which is different from the first direction, and a touch driving circuit configured to drive the X-touch electrode line and the Y-touch electrode line, wherein the touch driving circuit is configured to drive the X-touch electrode line and the Y-touch electrode line in divided periods in a first touch sensing mode, and drive some touch electrode line and remaining touch electrode line of one touch electrode line of the X-touch electrode line and the Y-touch electrode line in divided periods, and drive the other touch electrode line simultaneously.

According to various the present disclosure of the disclosure, a touch driving circuit comprises a first driving part configured to drive a plurality of touch electrode lines disposed in a first direction, and a second driving part configured to drive a plurality of touch electrode lines disposed in a second direction which is different from the first direction, wherein at least one of the first driving part and the second driving part outputs a touch driving signal to some touch electrode line and remaining touch electrode line of the plurality of touch electrode lines in divided periods in a first touch sensing mode.

According to various the present disclosure of the disclosure, as performing a touch sensing based on a self-capacitance before performing a touch sensing based on a mutual-capacitance, an accuracy of the touch sensing may be increased while improving a sensitivity of the touch sensing.

Furthermore, by dividing and driving channels in a timely divided period during a period which a touch sensing based on a self-capacitance is performed, an influence of a noise by a display driving is reduced and a performance of the touch sensing may be improved.

DESCRIPTION OF DRAWINGS

The above and other objects, features, and advantages of the present disclosure will be more clearly understood from the following detailed description, taken in conjunction with the accompanying drawings, in which:

FIGS. 13 and 14 are diagrams illustrating an example of a method for the touch driving circuit to perform a touch sensing in the touch panel according to the present disclosure;

DETAILED DESCRIPTION

Figure 1:
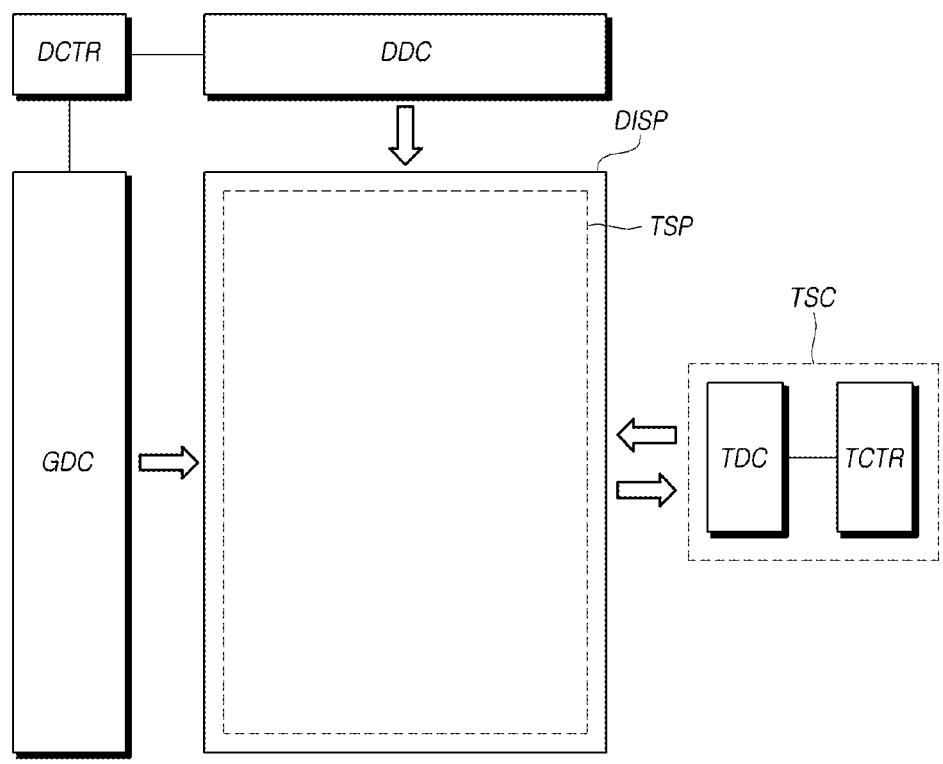
FIG. 1 is a diagram illustrating a schematic configuration of a touch display device according to the present disclosure.

In the following description of examples or the present disclosure of the present disclosure, reference will be made to the accompanying drawings in which it is shown by way of illustration specific examples or the present disclosure that can be implemented, and in which the same reference numerals and signs can be used to designate the same or like components even when they are shown in different accompanying drawings from one another. Further, in the following description of examples or the present disclosure of the present disclosure, detailed descriptions of well-known functions and components incorporated herein will be omitted when it is determined that the description may make the subject matter in some the present disclosure of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating a system configuration of a touch display device according to the present disclosure.

Referring to FIG. 1, the touch display device according to the present disclosure may provide both an image display function and a touch-sensing function.

To provide the image display function, the touch display device according to the present disclosure may include: a display panel DISP in which a plurality of data lines and a plurality of gate lines are disposed and a plurality of subpixels defined by the plurality of data lines and the plurality of gate lines are arrayed; a data driver (or data driver circuit) DDC driving the plurality of data lines; a gate driver (or gate driver circuit) GDC driving the plurality of gate lines; a display controller DCTR controlling the data driver DDC and gate driver GDC; and the like.

Each of the data driver DDC, the gate driver GDC, and the display controller DCTR may be implemented as one or more separate components. In some cases, two or more of the data driver DDC, the gate driver GDC, and the display controller DCTR may be integrated into a single component. For example, the data driver DDC and the display controller DCTR may be implemented as a single integrated circuit (IC) chip.

To provide the touch-sensing function, the touch display device according to the present disclosure may include: a touch panel TSP including a plurality of touch electrodes; and a touch-sensing circuit TSC supplying a touch driving signal to the touch panel TSP, detecting a touch-sensing signal from the touch panel TSP, and detecting a touch of a user or determining a touch position (touch coordinates) on the touch panel TSP on the basis of a detected touch-sensing signal.

For example, the touch-sensing circuit TSC may include: a touch driving circuit TDC supplying a touch driving signal to the touch panel TSP and detecting a touch-sensing signal from the touch panel TSP; a touch controller TCTR determining at least one of the touch of the user and the touch coordinates on the basis of the touch-sensing signal detected by the touch driving circuit TDC; and the like.

The touch driving circuit TDC may include a first circuit part supplying the touch driving signal to the touch panel TSP and a second circuit part detecting the touch-sensing signal from the touch panel TSP.

The touch driving circuit TDC and the touch controller TCTR may be provided as separate components or, in some cases, may be integrated into a single component.

In addition, each of the data driver DDC, the gate driver GDC, and the touch driving circuit TDC is implemented as one or more ICs, and in terms of electrical connection to the display panel DISP, may have a chip-on-glass (COG) structure, a chip-on-film (COF) structure, a tape carrier package (TCP) structure, or the like. In addition, the gate driver GDC may have a gate-in-panel (GIP) structure.

In addition, each of the circuit configurations DDC, GDC, and DCTR for display driving and the circuit configurations TDC and TCTR for touch sensing may be implemented as one or more separate components. In some cases, one or more of the display driving circuit configurations DDC, GDC, and DCTR and one or more of the touch-sensing circuit configurations TDC and TCTR may be functionally integrated into one or more components.

For example, the data driver DDC and the touch driving circuit TDC may be integrated into one or more IC chips. In a case in which the data driver DDC and the touch driving circuit TDC are integrated into two or more IC chips, each of the two or more IC chips may have both a data driving function and a touch driving function.

In addition, the touch display device according to the present disclosure may be various types of devices, such as an organic light-emitting diode (OLED) display device and a liquid crystal display (LCD) device. Hereinafter, the touch display device will be described as an OLED display device for the sake of brevity. That is, although the display panel DISP may be various types of devices, such as an OLED and an LCD, the display panel DISP will be described as an OLED panel as an example for the sake of brevity.

In addition, as will be described later, the touch panel TSP may include a plurality of touch electrodes to which the touch driving signal is applicable or from which the touch-sensing signal is detectable; a plurality of touch routing lines connecting the plurality of touch electrodes to the touch driving circuit TDC; and the like.

The touch panel TSP may be located outside of the display panel DISP. That is, the touch panel TSP and the display panel DISP may be fabricated separately and combined thereafter. Such a touch panel TSP is referred to as an add-on touch panel.

Alternatively, the touch panel TSP may be disposed inside of the display panel DISP. That is, when the display panel DISP is fabricated, touch sensor structures of the touch panel TSP, including the plurality of touch electrodes, the plurality of touch routing lines, and the like, may be provided together with electrodes and signal lines used for the display driving. Such a touch panel TSP is referred to as an in-cell touch panel. Hereinafter, for the sake of brevity, the touch panel TSP will be described as an in-cell touch panel TSP as an example.

Figure 2:
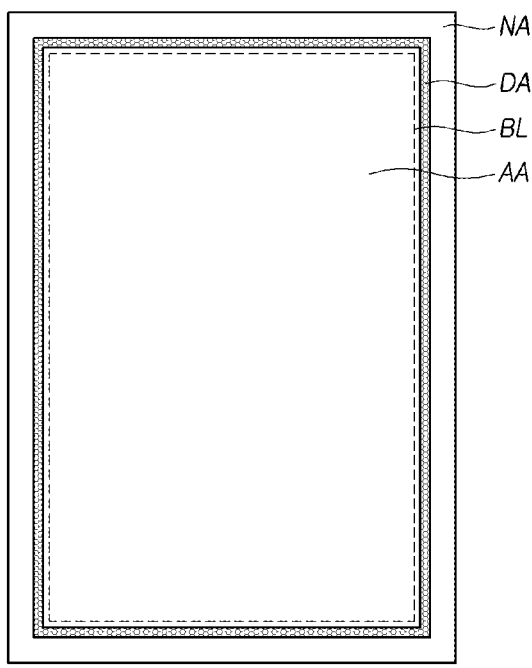
FIG. 2 is a diagram schematically illustrating the display panel of the touch display device according to the present disclosure.

FIG. 2 is a diagram schematically illustrating the display panel DISP of the touch display device according to the present disclosure.

Referring to FIG. 2, the display panel DISP may include an active area AA on which images are displayed and a non-active area NA located outside of an outer boundary line BL of the active area AA.

In the active area AA of the display panel DISP, a plurality of subpixels for displaying images are arrayed, and a variety of electrodes and signal lines for the display driving area are disposed.

In addition, the plurality of touch electrodes for the touch sensing, the plurality of touch routing lines electrically connected to the plurality of touch electrodes, and the like may be disposed in the active area AA of the display panel DISP. Accordingly, the active area AA may also be referred to as a touch-sensing area in which the touch sensing may be performed.

In the non-active area NA of the display panel DISP, link lines produced by extending a variety of signal lines disposed in the active area AA or link lines electrically connected to the variety of signal lines disposed in the active area AA and pads electrically connected to the link lines may be disposed. The pads disposed in the non-active area NA may be bonded or electrically connected to the display driving circuits, such as DDC and GDC.

In addition, in the non-active area NA of the display panel DISP, link lines produced by extending a plurality of touch routing lines disposed in the active area AA or link lines electrically connected to the plurality of touch routing lines disposed in the active area AA and pads electrically connected to the link lines may be disposed. The pads disposed in the non-active area NA may be bonded or electrically connected to the touch driving circuit TDC.

In the non-active area NA, portions produced by expanding portions of the outermost touch electrodes among the plurality of touch electrodes disposed in the active area AA may be provided, and one or more electrodes (e.g. touch electrodes) made of the same material as the plurality of touch electrodes disposed in the active area AA may be further disposed.

That is, the entirety of the plurality of touch electrodes disposed in the display panel DISP may be located in the active area AA, specific touch electrodes (e.g. the outermost touch electrodes) among the plurality of touch electrodes disposed in the display panel DISP may be located in the non-active area NA, or specific touch electrodes (e.g. the outermost touch electrodes) among the plurality of touch electrodes disposed in the display panel DISP may extend across at least a portion of the active area AA and at least a portion of the non-active area NA.

In addition, referring to FIG. 2, the display panel DISP of the touch display device according to the present disclosure may include a dam area DA in which a dam DAM (shown in FIG. 9) is disposed, the dam DAM serving to prevent a layer (e.g. an encapsulation in the OLED display panel) in the active area AA from collapsing.

The dam area DA may be located at the boundary between the active area AA and the non-active area NA, in a location of the non-active area NA at the periphery of the active area AA, or the like.

The dam disposed in the dam area DA may be disposed to surround the active area AA in all directions or only at the periphery of one or more portions (i.e. portions in which a fragile layer is located) of the active area AA.

The dams disposed in the dam area DA may be connected to form a single pattern or to form two or more separate patterns. In addition, in the dam area DA, only a first dam may be disposed, or two dams (i.e. a first dam and a second dam) may be disposed, or three or more dams may be disposed.

In the dam area DA, the first dam may only be provided in one direction, and both the first dam and the second dam may be provided in the other direction.

Figure 3:
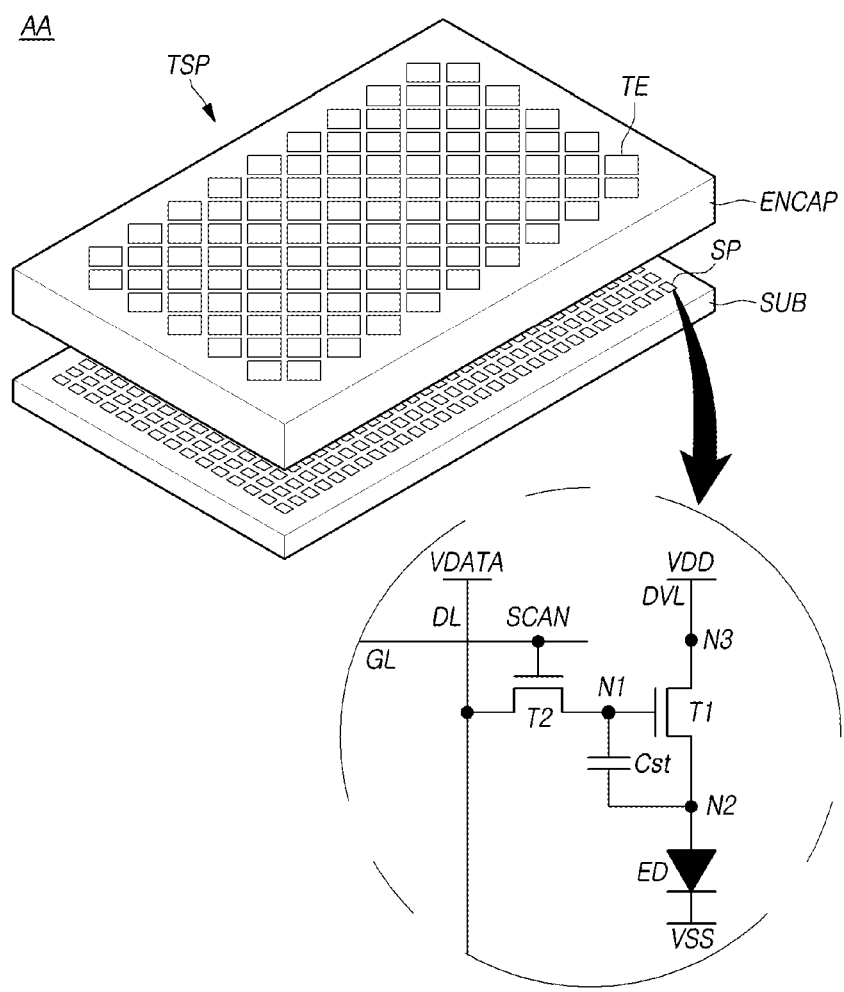
FIG. 3 is a diagram illustrating a structure in which the touch panel is disposed as an in-cell structure in the display panel according to the present disclosure.

FIG. 3 is a diagram illustrating a structure in which the touch panel TSP is disposed as an in-cell structure in the display panel DISP according to the present disclosure.

Referring to FIG. 3, a plurality of subpixels SP are arrayed on a substrate SUB in the active area AA of the display panel DISP.

Each of the subpixels SP may include an emitting device ED, a first transistor T1 driving the emitting device ED, a second transistor T2 delivering a data voltage VDATA to a first node N1 of the first transistor T1, a storage capacitor Cst maintaining a predetermined voltage for a single frame, and the like.

The first transistor T1 may include the first node N1 to which the data voltage VDATA is applicable, a second node N2 electrically connected to the emitting device ED, and a third node N3 to which a driving voltage is applied from a driving voltage line DVL. The first node N1 may be a gate node, the second node N2 may be a source node or a drain node, and the third node N3 may be a drain node or a source node. Such a first transistor T1 is also referred to as a driving transistor driving the emitting device ED.

The emitting device ED may include a first electrode (e.g. an anode), an emissive layer, and a second electrode (e.g. a cathode). The first electrode may be electrically connected to the second node N2 of the first transistor T1, and the second electrode may have a base voltage VSS applied thereto.

The emissive layer of the emitting device ED may be an organic emissive layer containing an organic material. In this case, the emitting device ED may be an organic light-emitting diode (OLED).

The second transistor T2 may be on/off controlled by a scan signal SCAN applied through a gate line GL and be electrically connected to the first node N1 of the first transistor T1 and a data line DL. Such a second transistor T2 is also referred to as a switching transistor.

When the second transistor T2 is turned on by the scan signal SCAN, the second transistor T2 delivers the data voltage VDATA supplied through the data line to the first node N1 of the first transistor T1.

The storage capacitor Cst may be electrically connected to the first node N1 and the second node N2 of the first transistor T1.

As illustrated in FIG. 3, each of the subpixels SP may have a 2T1C comprised of two transistors T1 and T2 and a single capacitor Cst. In some cases, each of the subpixels SP may further include one or more transistors or one or more capacitors.

The storage capacitor Cst may be an external capacitor intentionally designed to be disposed externally of the first transistor T1, rather than a parasitic capacitor (e.g. Cgs or Cgd), i.e. an internal capacitor present between the first node N1 and the second node N2 of the first transistor T1.

Each of the first transistor T1 and the second transistor T2 may be an n-type transistor or a p-type transistor.

As described above, circuit components, including the emitting device ED, two or more transistors T1 and T2, and one or more capacitor Cst, are disposed in the display panel DISP. Since such circuit components (in particular, the emitting device ED) are vulnerable to external moisture, oxygen, or the like, an encapsulation ENCAP preventing external moisture or oxygen from penetrating the circuit elements (in particular, the emitting device ED) may be disposed in the display panel DISP.

Such an encapsulation ENCAP may be a single layer or have a multilayer structure.

In addition, in the touch display device according to the present disclosure, the touch panel TSP may be disposed on the encapsulation ENCAP.

That is, in the touch display device, a touch sensor structure, including the plurality of touch electrodes TE, of the touch panel TSP may be disposed on the encapsulation ENCAP.

In the touch sensing, the touch driving signal or the touch-sensing signal may be applied to the touch electrodes TE. Then, in the touch sensing, a potential difference may be produced between a touch electrode TE and a cathode disposed on both sides of the encapsulation ENCAP, thereby generating unnecessary parasitic capacitance. Since such parasitic capacitance may reduce touch sensitivity, the distance between the touch electrode TE and the cathode may be designed to be a predetermined value (e.g. 1 µm) or more in consideration of the thickness of the panel, a panel fabrication process, display performance, and the like in order to reduce the parasitic capacitance. In this regard, for example, the thickness of the encapsulation ENCAP may be designed to be 1 µm or more.

Figure 4:
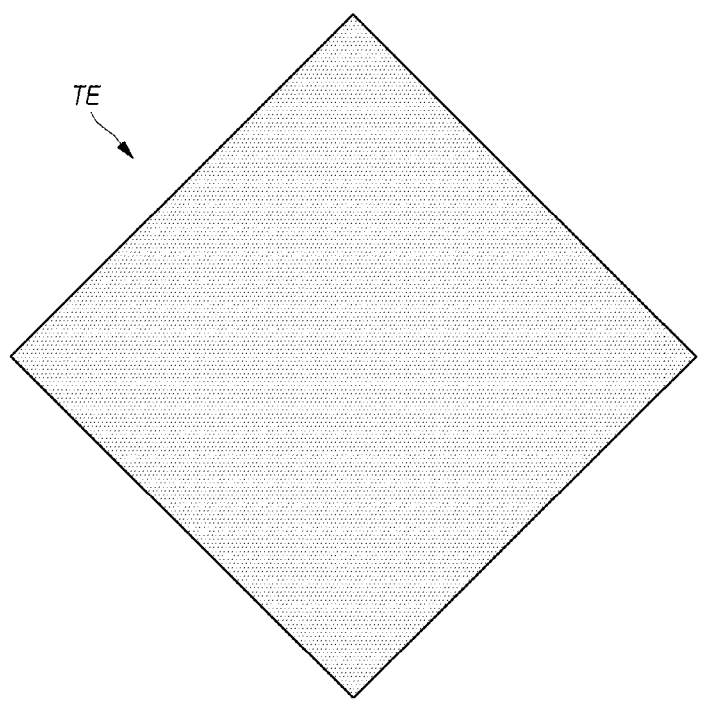
FIGS. 4 and 5 are diagrams illustrating types of touch electrodes disposed in the display panel according to the present disclosure.
Figure 5:
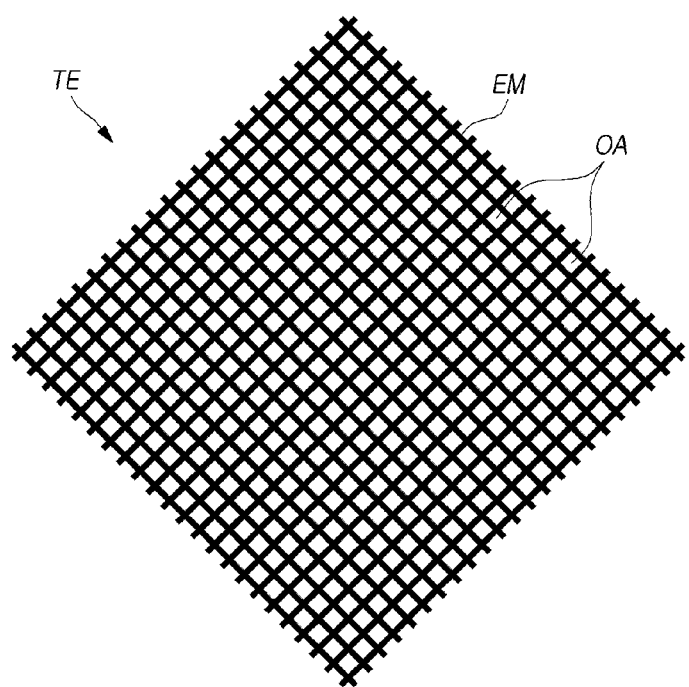

FIGS. 4 and 5 are diagrams illustrating types of touch electrodes TE disposed in the display panel DISP according to the present disclosure.

As illustrated in FIG. 4, each of the touch electrodes TE disposed in the display panel DISP may be a plate-shaped electrode metal without an open area. In this case, each of the touch electrodes TE may be a transparent electrode. That is, each of the touch electrodes TE may be made of a transparent electrode material such that light emitted by the plurality of subpixels SP disposed below the touch electrodes TE may pass through the touch electrodes TE.

Alternatively, as illustrated in FIG. 5, each of the touch electrodes TE disposed in the display panel DISP may be an electrode metal EM in the shape of a patterned mesh having two or more open areas OA.

The electrode metal EM is a portion substantially corresponding to the touch electrode TE and is a portion to which the touch driving signal is applied or from which the touch-sensing signal is detected.

As illustrated in FIG. 5, in a case in which each of the touch electrodes TE is the electrode metal EM in the shape of a patterned mesh, two or more open areas OA may be present in the area of the touch electrode TE.

Each of the plurality of open areas OA provided in each of the touch electrodes TE may correspond to the emitting area of one or more subpixels SP. That is, the plurality of open areas OA are passages allowing light emitted from the plurality of subpixels SP located therebelow to pass upward therethrough. Hereinafter, for the sake of brevity, each of the touch electrodes TE will be described as a mesh-shaped electrode metal EM as an example.

The electrode metal EM corresponding to each of the touch electrodes TE may be located on a bank disposed in an area, except for the emitting area of two or more subpixels SP.

In addition, a method of fabricating a plurality of touch electrode TE may include forming a mesh-shaped electrode metal EM having a wider area and then cutting the electrode metal EM to form a predetermined pattern such that portions of the electrode metal EM are electrically separated from each other, thereby fabricating a plurality of touch electrodes TE.

The outline of the touch electrode TE may have a rectangular shape, such as a diamond or a rhombus shape, as illustrated in FIGS. 4 and 5, or a variety of other shapes, such as a triangle, a pentagon, or a hexagon.

Figure 6:
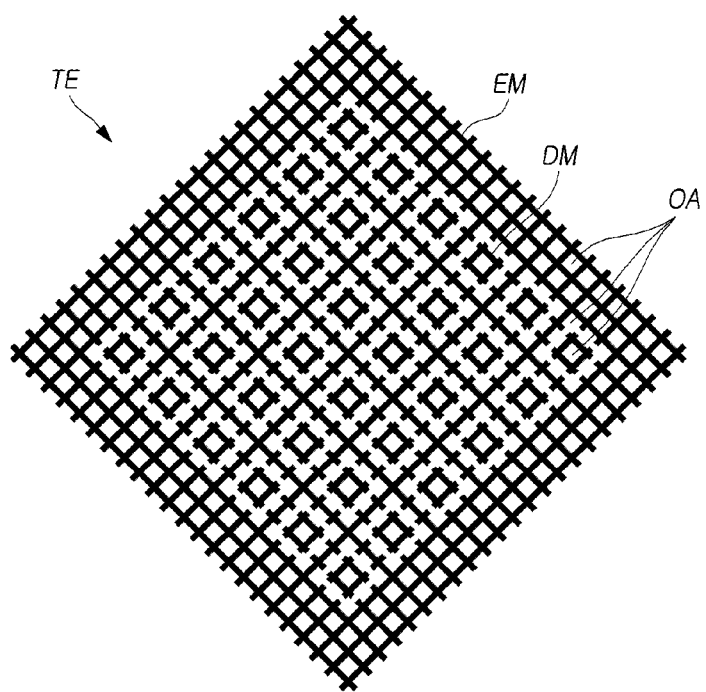
FIG. 6 is a diagram illustrating the mesh-shaped touch electrode illustrated in FIG. 5.

FIG. 6 is a diagram illustrating the mesh-shaped touch electrode TE illustrated in FIG. 5.

Referring to FIG. 6, in the area of each of the touch electrodes TE, one or more dummy metals DM disconnected from the mesh-shaped electrode metal EM may be provided.

The electrode metal EM is a portion substantially corresponding to the touch electrode TE and is a portion to which the touch driving signal is applied or from which the touch-sensing signal is detected. In contrast, the dummy metals DM are portions to which the touch driving signal is not applied and from which the touch-sensing signal is not detected, although the dummy metals DM are portions located in the area of the touch electrode TE. That is, the dummy metals DM may be electrically floating metals.

Thus, the electrode metal EM may be electrically connected to the touch driving circuit TDC, but none of the dummy metals DM are electrically connected to the touch driving circuit TDC.

In the area of each of the entire touch electrodes TE, one or more dummy metals DM may be provided while being disconnected from the electrode metals EM.

Alternatively, one or more dummy metals DM may be provided in the area of each of specific touch electrodes TE among the entire touch electrodes TE while being disconnected from the electrode metal EM. That is, no dummy metals DM may be provided in the areas of the other touch electrodes TE.

The function of the dummy metals DM is related to a visibility issue. In a case in which only the mesh-shaped electrode metal EM is present in the area of the touch electrode TE without one or more dummy metals DM being present in the area of the touch electrode TE as illustrated in FIG. 5, the outline of the electrode metal EM may appear on the screen, thereby causing a visibility issue.

In contrast, in a case in which one or more dummy metals DM are present in the area of the touch electrode TE as illustrated in FIG. 6, the outline of the electrode metal EM appearing on the screen, i.e. the visibility issue, may be prevented.

In addition, touch sensitivity may be improved by adjusting the magnitude of capacitance according to each of the touch electrodes TE by adjusting the presence or absence or the number (or ratio) of the dummy metals DM of each of the touch electrodes TE.

In addition, specific points of the electrode metal EM provided in the area of a single touch electrode TE may be cut, so that the cut electrode metal EM form dummy metals DM. That is, the electrode metal EM and the dummy metals DM may be made of the same material provided on the same layer.

In addition, the touch display device according to the present disclosure may detect a touch on the basis of capacitance generated on the touch electrode TE.

The touch display device according to the present disclosure may detect a touch by a capacitance-based touch sensing method, more particularly, mutual capacitance-based touch sensing or self-capacitance-based touch sensing.

In the mutual capacitance-based touch sensing, the plurality of touch electrodes TE may be divided into driving touch electrodes (or transmitting touch electrodes) to which the touch driving signal is applied and sensing touch electrodes (or receiving touch electrodes) detecting the touch sensing signal and generating capacitance together with the driving touch electrodes.

In the mutual capacitance-based touch sensing, the touch-sensing circuit TSC detects a touch and determines touch coordinates on the basis of changes in the capacitance (i.e. mutual capacitance) occurring between the driving touch electrodes and the sensing touch electrodes, depending on the presence or absence of a pointer, such as a finger or a pen.

In the self-capacitance-based touch sensing, each of the touch electrodes TE serves as both a driving touch electrode and a sensing touch electrode. That is, the touch-sensing circuit TSC detects a touch and determines touch coordinates by applying the touch driving signal to one or more touch electrodes TE, detecting the touch-sensing signal through the touch electrode TE to which the touch driving signal is applied, and recognizing changes in the capacitance between the pointer, such as a finger or a pen, and the touch electrode TE, on the basis of the detected touch-sensing signal. Accordingly, in the self-capacitance-based touch sensing, there is no difference between the driving touch electrodes and the sensing touch electrodes.

As described above, the touch display device according to aspect may perform the touch sensing by the mutual capacitance-based touch sensing or the self-capacitance-based touch sensing. Hereinafter, for the sake of brevity, the touch display device performing the mutual capacitance-based touch sensing and having a touch sensor structure for the mutual capacitance-based touch sensing will be described as an example.

Figure 7:
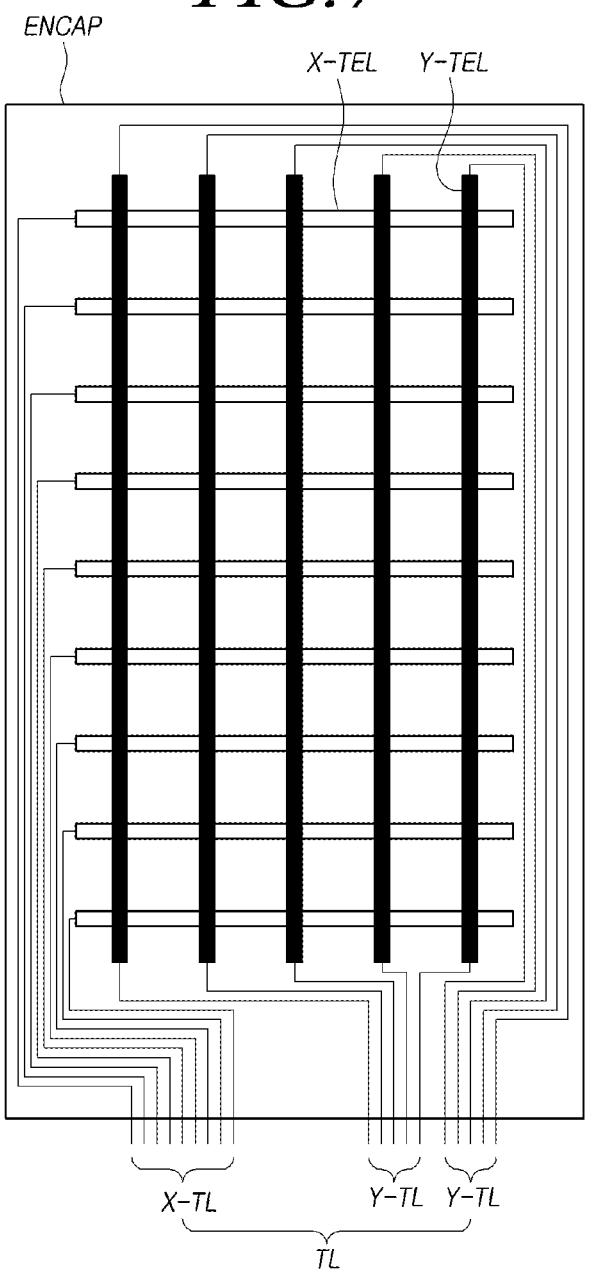
FIG. 7 is a diagram schematically illustrating a touch sensor structure in the display panel according to the present disclosure.
Figure 8:
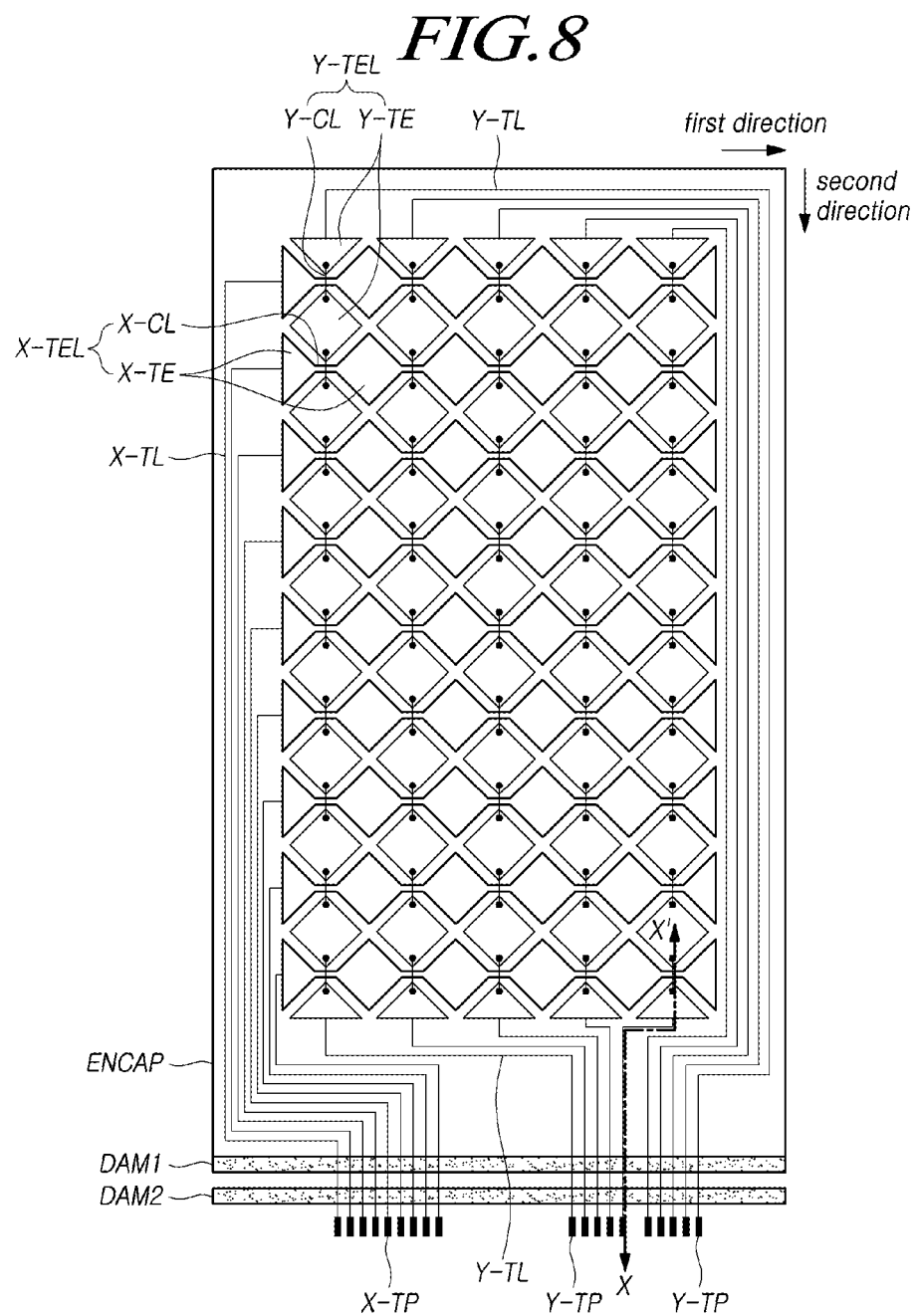
FIG. 8 is a diagram illustrating an example of the touch sensor structure illustrated in FIG. 7.

FIG. 7 is a diagram schematically illustrating a touch sensor structure in the display panel DISP according to the present disclosure, and FIG. 8 is a diagram illustrating an example of the touch sensor structure illustrated in FIG. 7.

Referring to FIG. 7, the touch sensor structure for the mutual capacitance-based touch sensing may include a plurality of X-touch electrode lines X-TEL and a plurality of Y-touch electrode lines Y-TEL. Here, the plurality of X-touch electrode lines X-TEL and the plurality of Y-touch electrode lines Y-TEL are located on the encapsulation ENCAP.

Each of the plurality of X-touch electrode lines X-TEL may be disposed in a first direction, and the plurality of Y-touch electrode lines Y-TEL may be disposed in a second direction different from the first direction.

Herein, the first direction and the second direction may be different directions. For example, the first direction may be the X-axis direction, while the second direction may be the Y-axis direction. Alternatively, the first direction may be the Y-axis direction, while the second direction may be the X-axis direction. In addition, the first direction and the second direction may or may not intersect perpendicularly. In addition, the terms "column" and "row" as used herein are relative terms. The column and the row may be switched depending on the viewing perspective.

Each of the plurality of X-touch electrode lines X-TEL may be may be comprised of a plurality of X-touch electrodes X-TE electrically connected to each other. Each of the plurality of Y-touch electrode lines Y-TEL may be comprised of a plurality of Y-touch electrodes Y-TE electrically connected to each other.

Here, the plurality of X-touch electrodes X-TE and the plurality of Y-touch electrodes Y-TE are electrodes included in the plurality of touch electrodes TE, and have different functions.

For example, the plurality of X-touch electrodes X-TE constituting each of the plurality of X-touch electrode lines X-TEL may be the driving touch electrodes, while the plurality of Y-touch electrodes Y-TE constituting each of the plurality of Y-touch electrode lines Y-TEL may be the sensing touch electrodes. In this case, each of the plurality of X-touch electrode lines X-TEL corresponds to a driving touch electrode lines, and each of the plurality of Y-touch electrode lines Y-TEL corresponds to a sensing touch electrode line.

Alternatively, the plurality of X-touch electrodes X-TE constituting each of the plurality of X-touch electrode lines X-TEL may be the sensing touch electrodes, while the plurality of Y-touch electrodes Y-TE constituting each of the plurality of Y-touch electrode lines Y-TEL may be the driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal for the touch sensing may include a plurality of touch routing lines TL in addition to the plurality of X-touch electrode lines X-TEL and the plurality of Y-touch electrode lines Y-TEL.

The plurality of touch routing lines TL may include one or more X-touch routing lines X-TL connected to the plurality of X-touch electrode lines X-TEL, respectively, and one or more Y-touch routing lines Y-TL connected to the plurality of Y-touch electrode lines Y-TEL, respectively.

Referring to FIG. 8, each of the plurality of X-touch electrode lines X-TEL may include a plurality of X-touch electrodes X-TE disposed in the same row (or column) and one or more X-touch electrode connecting lines X-CL electrically connecting the plurality of X-touch electrodes X-TE. Here, the X-touch electrode connecting lines X-CL respectively connecting two adjacent X-touch electrodes X-TE may be metals integrated with the two adjacent X-touch electrodes X-TE (shown in FIG. 8) or metals connected to the two adjacent X-touch electrodes X-TE via contact holes.

Each of the plurality of Y-touch electrode lines Y-TEL may include a plurality of Y-touch electrodes Y-TE disposed in the same column (or row) and one or more Y-touch electrode connecting lines Y-CL electrically connecting the plurality of Y-touch electrodes Y-TE. Here, the Y-touch electrode connecting lines Y-CL respectively connecting two adjacent Y-touch electrodes Y-TE may be metals integrated with the two adjacent Y-touch electrodes Y-TE or metals connected to the two adjacent Y-touch electrodes Y-TE via contact holes (shown in FIG. 8).

In areas in which the X-touch electrode lines X-TEL intersect the Y-touch electrode lines Y-TEL (i.e. touch electrode line intersecting areas), the X-touch electrode connecting lines X-CL may intersect the Y-touch electrode connecting lines Y-CL.

In a case in which the X-touch electrode connecting lines X-CL intersect the Y-touch electrode connecting lines Y-CL in the touch electrode line intersecting areas as described above, the X-touch electrode connecting lines X-CL must be located on a layer different from that of the Y-touch electrode connecting lines Y-CL.

Accordingly, the plurality of X-touch electrodes X-TE, the plurality of X-touch electrode connecting lines X-CL, the plurality of Y-touch electrodes Y-TE, the plurality of Y-touch electrode lines Y-TEL, and the plurality of Y-touch electrode connecting lines Y-CL may be located on two or more layers, such that the plurality of X-touch electrode lines X-TEL alternate with the plurality of Y-touch electrode lines Y-TEL.

Referring to FIG. 8, each of the plurality of X-touch electrode lines X-TEL is electrically connected to a corresponding X-touch pad X-TP through one or more X-touch routing lines X-TL. That is, the outermost X-touch electrode X-TE among the plurality of X-touch electrodes X-TE included in a single X-touch electrode line X-TEL is electrically connected to a corresponding X-touch pad X-TP via the X-touch routing line X-TL.

Each of the plurality of Y-touch electrode lines Y-TEL is electrically connected to corresponding Y-touch pads Y-TP through one or more Y-touch routing lines Y-TL. That is, the outermost Y-touch electrodes Y-TE among the plurality of Y-touch electrodes Y-TE included in a single Y-touch electrode line Y-TEL is electrically connected to the corresponding Y-touch pads Y-TP through the Y-touch routing lines Y-TL.

In addition, as illustrated in FIG. 8, the plurality of X-touch electrode lines X-TEL and the plurality of Y-touch electrode lines Y-TEL may be disposed on the encapsulation ENCAP. That is, the plurality of X-touch electrodes X-TE, constituting the plurality of X-touch electrode lines X-TEL, and the plurality of X-touch electrode connecting lines X-CL may be disposed on the encapsulation ENCAP. The plurality of Y-touch electrodes Y-TE, constituting the plurality of Y-touch electrode lines Y-TEL, and the plurality of Y-touch electrode connecting lines Y-CL may be disposed on the encapsulation ENCAP.

In addition, as illustrated in FIG. 8, the plurality of X-touch routing lines X-TL electrically connected to the plurality of X-touch electrode lines X-TEL may be disposed on the encapsulation ENCAP and extend to a location in which the encapsulation ENCAP is not provided, thereby being electrically connected to a plurality of X-touch pads X-TP, respectively. The plurality of Y-touch routing lines Y-TL electrically connected to the plurality of Y-touch electrode lines Y-TEL may be disposed on the encapsulation ENCAP and extend to a location in which encapsulation ENCAP is not provided, thereby being electrically connected to a plurality of Y-touch pads Y-TP, respectively. Here, the encapsulation ENCAP may be located in the active area AA and, in some cases, may expand to the non-active area NA.

In addition, as described above, a dam area DA may be provided at the boundary between the active area AA and the non-active area NA or in the non-active area NA at the periphery of the active area AA in order to prevent a layer (e.g. an encapsulation in the OLED display panel) in the active area AA from collapsing.

As illustrated in FIG. 8, for example, a first dam DAM1 and a second dam DAM2 may be disposed in the dam area DA. Here, the second dam DAM2 may be located more outward than the first dam DAM1.

In a manner different from that illustrated in FIG. 8, only the first dam DAM1 may be located in the dam area DA. In some cases, not only the first dam DAM1 and the second dam DAM2 but also one or more additional dam may be disposed in the dam area DA.

Referring to FIG. 8, the encapsulation ENCAP may be located on a side of the first dam DAM1 or be located both on a side of and above the first dam DAM1.

Figure 9:
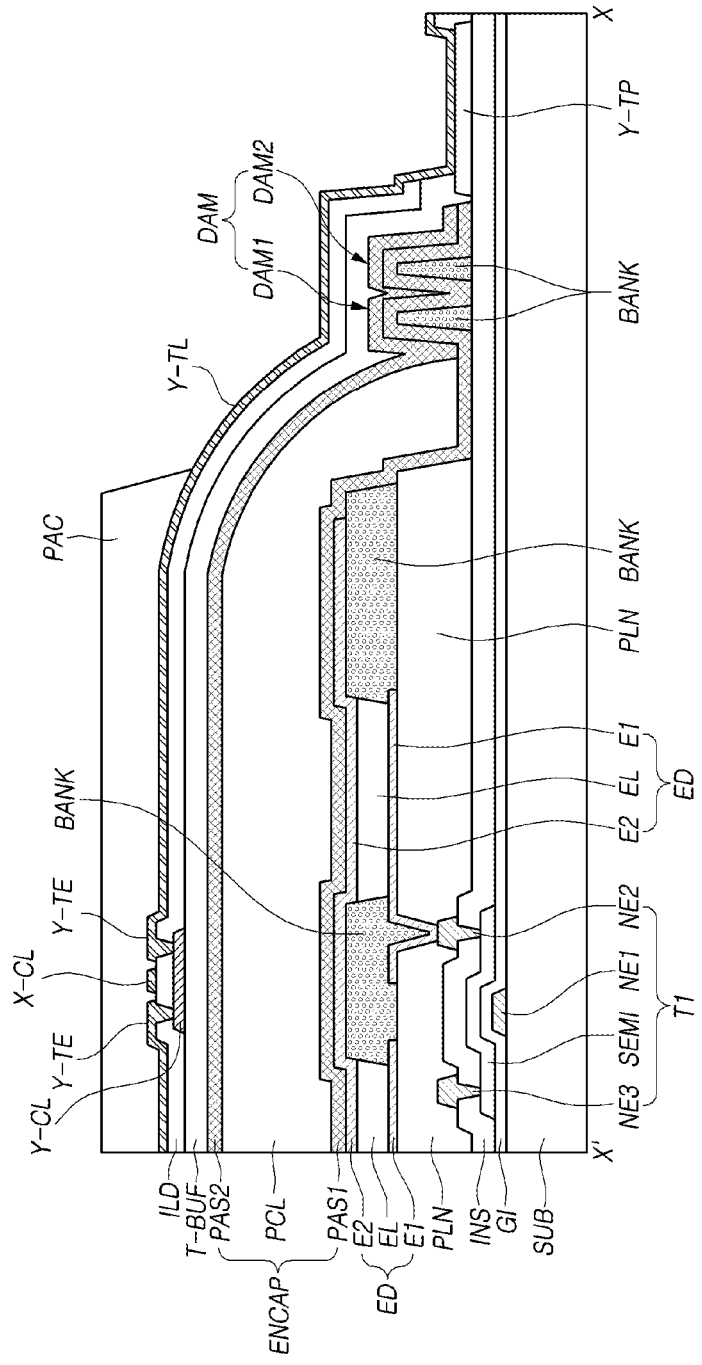
FIG. 9 is a cross-sectional diagram illustrating portions of the display panel according to the present disclosure, taken along line X-X' in FIG. 8.

FIG. 9 is a cross-sectional diagram illustrating portions of the display panel DISP according to the present disclosure, taken along line X-X' in FIG. 8. In FIG. 9, the touch electrode TE is illustrated in the shape of a plate. However, this is illustrative only, and the touch electrode TE may be mesh shaped. In a case in which the touch electrode TE is mesh shaped, the open areas OA of the touch electrode TE may be located above the emissive areas of subpixels SP.

The first transistor T1, i.e. the driving transistor in each of the subpixels SP in the active area AA, is disposed on the substrate SUB.

The first transistor T1 includes a first node electrode NE1 corresponding to the gate electrode, a second node electrode NE2 corresponding to a source electrode or a drain electrode, a third node electrode NE3 corresponding to a drain electrode or a source electrode, a semiconductor layer SEMI, and the like.

The first node electrode NE1 and the semiconductor layer SEMI may be located on both sides of a gate insulating film GI to overlap each other. The second node electrode NE2 may be provided on an insulating layer INS to be in contact with one side of the semiconductor layer SEMI, while the third node electrode NE3 may be provided on the insulating layer INS to be in contact with the other side of the semiconductor layer SEMI.

The emitting device ED may include a first electrode E1 corresponding to an anode (or cathode), an emitting layer EL provided on the first electrode E1, a second electrode E2 corresponding to a cathode (or anode) provided on the emitting layer EL, and the like.

The first electrode E1 is electrically connected to the second node electrode NE2 of the first transistor T1, exposed through a pixel contact hole extending through a planarization layer PLN.

The emitting layer EL is provided on the first electrode E1 in the emitting area provided by banks BANK. The emitting layer EL is provided on the first electrode E1 and is comprised of a hole-related layer, an emissive layer, and an electron-related layer stacked in the stated order or inversely. The second electrode E2 is provided on the side of the emitting layer EL opposite to the first electrode E1.

The encapsulation ENCAP prevents external moisture or oxygen from penetrating the emitting device ED vulnerable to external moisture, oxygen, or the like.

The encapsulation ENCAP may be a single layer or, as illustrated in FIG. 9, be comprised of a plurality of layers PAS1, PCL, and PAS2.

For example, in a case in which the encapsulation ENCAP is comprised of the plurality of layers PAS1, PCL, and PAS2, the encapsulation ENCAP may include one or more inorganic encapsulation layers PAS1 and PAS2 and one or more organic encapsulation layers PCL. As a specific example, the encapsulation ENCAP may have a structure in which the first inorganic encapsulation layer PAS1, the organic encapsulation layer PCL, and the second inorganic encapsulation layer PAS2 are stacked in order.

Here, the organic encapsulation layer PCL may further include at least one organic encapsulation layer or at least one inorganic encapsulation layer.

The first inorganic encapsulation layer PAS1 is provided on the substrate SUB, on which the second electrode E2 corresponding to the cathode is provided, so as to be closest to the emitting device ED. The first inorganic encapsulation layer PAS1 is made of an inorganic insulating material, such as silicon nitride (SiNx), silicon oxide (SiOx), silicon oxynitride (SiON), or aluminum oxide ($Al_2O_3$), which may be deposited at a low temperature. Since the first inorganic encapsulation layer PAS1 is deposited in a low-temperature atmosphere, the first inorganic encapsulation layer PAS1 may prevent the emitting layer EL containing an organic material vulnerable to a high-temperature atmosphere from being damaged during deposition processing.

The organic encapsulation layer PCL may be provided in an area smaller than the area of the first inorganic encapsulation layer PAS1. In this case, the organic encapsulation layer PCL may be configured to expose both edges of the first inorganic encapsulation layer PAS1. The organic encapsulation layer PCL may serve as a buffer to reduce stress between the layers caused by bending of the touch display device and serve to enhance planarization performance. The organic encapsulation layer PCL may be made of, for example, an organic insulating material, such as an acrylic resin, an epoxy resin, polyimide, polyethylene, silicon oxycarbon (SiOC).

In addition, in a case in which the organic encapsulation layer PCL is fabricated by inkjet printing, one or more dams DAM may be provided in the dam area DA corresponding to the boundary between the non-active area NA and the active area AA or a portion of the non-active area NA.

For example, as illustrated in FIG. 9, the dam area DA is located between a pad area in the non-active area NA and the active area AA. The pad area refers to a portion of the non-active area NA in which the plurality of X-touch pads X-TP and the plurality of Y-touch pads Y-TP are provided. In the dam area DA, the first dam DAM1 adjacent to the active area AA and the second dam DAM2 adjacent to the pad area may be provided.

The one or more dams DAM disposed in the dam area DA may prevent the organic encapsulation layer PCL in a liquid form from collapsing in the direction of the non-active area NA and penetrating into the pad area when the organic encapsulation layer PCL in the liquid form is dropped to the active area AA.

This effect may be further increased by the provision of the first dam DAM1 and the second dam DAM2 as illustrated in FIG. 9.

At least one of the first dam DAM1 and the second dam DAM2 may have a single layer or multilayer structure. For example, at least one of the first dam DAM1 and the second dam DAM2 may be simultaneously made of the same material as at least one of the banks BANK and spacers (not shown). In this case, a dam structure may be provided without additional mask processing or an increase in cost.

In addition, as illustrated in FIG. 9, at least one of the first dam DAM1 and the second dam DAM2 may have a structure in which at least one of the first inorganic encapsulation layer PAS1 and the second inorganic encapsulation layer PAS2 is stacked on the banks BANK.

In addition, the organic encapsulation layer PCL containing an organic material may be located on an inner side of the first dam DAM1, as illustrated in FIG. 9.

Alternatively, the organic encapsulation layer PCL containing an organic material may be located above at least a portion of the first dam DAM1 and the second dam DAM2. For example, the organic encapsulation layer PCL may be located above the first dam DAM1.

The second inorganic encapsulation layer PAS2 may be provided on the substrate SUB on which the organic encapsulation layer PCL is provided, so as to cover the top surfaces and side surfaces of the organic encapsulation layer PCL and the first inorganic encapsulation layer PAS1. The second inorganic encapsulation layer PAS2 minimizes or prevents external moisture or oxygen from penetrating the first inorganic encapsulation layer PAS1 or the organic encapsulation layer PCL. The second inorganic encapsulation layer PAS2 is made of, for example, an inorganic insulating material, such as SiNx, SiOx, SiON, or $Al_2O_3$.

A touch buffer film T-BUF may be provided on the encapsulation ENCAP. The touch buffer film T-BUF may be located between the touch sensor metal, including the X and Y-touch electrodes X-TE and Y-TE and X and Y-touch electrode connecting lines X-CL and Y-CL, and the second electrode E2 of the emitting device ED.

The touch buffer film T-BUF may be designed to maintain a predetermined minimum distance (e.g. 1 μm) between the touch sensor metal and the second electrode E2 of the emitting device ED. Accordingly, this may reduce or prevent parasitic capacitance generated between the touch sensor metal and the second electrode E2 of the emitting device ED, thereby preventing touch sensitivity from being reduced by the parasitic capacitance.

Without the touch buffer film T-BUF, the touch sensor metal including the X and Y-touch electrodes X-TE and Y-TE and the X and Y-touch electrode connecting lines X-CL and Y-CL may be disposed on the encapsulation ENCAP.

In addition, the touch buffer film T-BUF may prevent the emitting layer EL containing the organic material from being penetrated by a chemical agent (e.g. a developing solution or an etching solution) used in fabrication processing of the touch sensor metal disposed on the touch buffer film T-BUF, external moisture, or the like. Accordingly, the touch buffer film T-BUF may prevent the emitting layer EL vulnerable to the chemical agent or moisture from being damaged.

The touch buffer film T-BUF is made of an organic insulating material producible at a low temperature equal to or lower than a predetermined temperature (e.g. 100° C.) and having a low dielectric constant of 1 to 3 in order to prevent the emitting layer EL containing the organic material vulnerable to high temperature from being damaged. For example, the touch buffer film T-BUF may be made of an epoxy-based material or a siloxane-based material. The touch buffer film T-BUF made of an inorganic insulating material and having a planarization performance may prevent the encapsulation layers PAS1, PCL, and PAS2 of the encapsulation ENCAP from being damaged or the touch sensor metal on the touch buffer film T-BUF from being fractured in response to the bending of the OLED display device.

According to the mutual capacitance-based touch sensor structure, the X-touch electrode lines X-TEL and the Y-touch electrode lines Y-TEL are disposed on the touch buffer film T-BUF, and the X-touch electrode lines X-TEL and the Y-touch electrode lines Y-TEL may be disposed such that the X-touch electrode lines X-TEL intersect the Y-touch electrode lines Y-TEL.

The Y-touch electrode lines Y-TEL may include the plurality of Y-touch electrodes Y-TE and the plurality of Y-touch electrode connecting lines Y-CL electrically connecting the plurality of Y-touch electrodes Y-TE.

As illustrated in FIG. 9, the plurality of Y-touch electrodes Y-TE and the plurality of Y-touch electrode connecting lines Y-CL may be disposed on different layers, on both sides of a touch insulating film ILD.

The plurality of Y-touch electrodes Y-TE may be spaced apart from each other by predetermined distances in the Y-axis direction. Each of the plurality of Y-touch electrodes Y-TE may be electrically connected to the other adjacent Y-touch electrodes Y-TE through the Y-touch electrode connecting lines Y-CL in the Y-axis direction.

The Y-touch electrode connecting lines Y-CL may be provided on the touch buffer film T-BUF and exposed through touch contact holes extending through the touch insulating film ILD to be electrically connected to the two adjacent Y-touch electrodes Y-TE in the Y-axis direction.

The Y-touch electrode connecting lines Y-CL may be disposed to overlap the banks BANK. Accordingly, the aperture ratio may be prevented from being decreased by the Y-touch electrode connecting lines Y-CL.

The X-touch electrode lines X-TEL may include the plurality of X-touch electrodes X-TE and the plurality of X-touch electrode connecting lines X-CL electrically connecting the plurality of X-touch electrodes X-TE.

The plurality of X-touch electrodes X-TE may be disposed on the touch insulating film ILD, spaced apart from each other by predetermined distances in the X-axis direction. Each of the plurality of X-touch electrodes X-TE may be electrically connected to the adjacent other X-touch electrodes X-TE through the X-touch electrode connecting lines X-CL in the X-axis direction.

The X-touch electrode connecting lines X-CL may be disposed on the same plane as the X-touch electrodes X-TE to be electrically connected to the two adjacent X-touch electrodes X-TE in the X-axis direction without separate contact holes or be integrated with the two adjacent X-touch electrodes X-TE in the X-axis direction.

The X-touch electrode connecting lines X-CL may be disposed to overlap the banks BANK. Accordingly, the aperture ratio may be prevented from being decreased by the X-touch electrode connecting lines X-CL.

In addition, the Y-touch electrode lines Y-TEL may be electrically connected to the touch driving circuit TDC through the Y-touch routing lines Y-TL and the Y-touch pads Y-TP. In the same manner, the X-touch electrode lines X-TEL may be electrically connected to the touch driving circuit TDC through the X-touch routing lines X-TL and the X-touch pads X-TP.

A pad cover electrode covering the X-touch pads X-TP and the Y-touch pads Y-TP may be further disposed.

The X-touch pads X-TP may be provided separately from the X-touch routing lines X-TL or be provided as extensions of the X-touch routing lines X-TL. The Y-touch pads Y-TP may be provided separately from the Y-touch routing lines Y-TL or be provided as extensions of the Y-touch routing lines Y-TL.

In a case in which the X-touch pads X-TP are extensions of the X-touch routing lines X-TL and the Y-touch pads Y-TP are extensions of the Y-touch routing lines Y-TL, the X-touch pads X-TP, the X-touch routing lines X-TL, the Y-touch pads Y-TP, and the Y-touch routing lines Y-TL may be comprised of the same material, i.e. a first conductive material. The first conductive material may have a single or multilayer structure made of a metal, such as Al, Ti, Cu, or Mo, having high corrosion resistance, high acid resistance, and high conductivity.

For example, each of the X-touch pads X-TP, the X-touch routing lines X-TL, the Y-touch pads Y-TP, and the Y-touch routing lines Y-TL comprised of the first conductive material may have a three-layer structure, such as Ti/Al/Ti or Mo/Al/Mo.

The pad cover electrode capable of covering the X-touch pads X-TP and the Y-touch pads Y-TP may be comprised of the same material as the X and Y-touch electrodes X-TE and Y-TE, i.e. a second conductive material. The second conductive material may be a transparent conductive material, such as indium tin oxide (ITO) or indium zinc oxide (IZO), having high corrosion resistance and acid resistance. The pad cover electrodes may be provided to be exposed from the touch buffer film T-BUF so as to be bonded to the touch driving circuit TDC or to a circuit film on which the touch driving circuit TDC is mounted.

The touch buffer film T-BUF may be provided to cover the touch sensor metal so as to prevent the touch sensor metal from being corroded by external moisture. For example, the touch buffer film T-BUF may be made of an organic insulating material or be provided as a circular polarizer or a film made of an epoxy or acrylic material. The touch buffer film T-BUF may not be provided on the encapsulation ENCAP. That is, the touch buffer film T-BUF may not be an essential component.

The Y-touch routing lines Y-TL may be electrically connected to the Y-touch electrodes Y-TE via touch routing line contact holes or be integrated with the Y-touch electrodes Y-TE.

Each of the Y-touch routing lines Y-TL may extend to the non-active area NA, past the top and side portions of the encapsulation ENCAP and the dams DAM, so as to be electrically connected to the Y-touch pads Y-TP. Accordingly, the Y-touch routing lines Y-TL may be electrically connected to the touch driving circuit TDC through the Y-touch pads Y-TP.

The Y-touch routing lines Y-TL may deliver the touch-sensing signal from the Y-touch electrodes Y-TE to the touch driving circuit TDC or deliver the touch driving signal, received from the touch driving circuit TDC, to the Y-touch electrodes Y-TE.

The X-touch routing lines X-TL may be electrically connected to the X-touch electrodes X-TE via the touch routing line contact holes or be integrated with the X-touch electrodes X-TE.

The X-touch routing lines X-TL may extend to the non-active area NA, past the top and side portions of the encapsulation ENCAP and the dams DAM, so as to be electrically connected to the X-touch pads Y-TP. Accordingly, the X-touch routing lines X-TL may be electrically connected to the touch driving circuit TDC through the X-touch pads X-TP.

The X-touch routing lines X-TL may deliver the touch driving signal, received from the touch driving circuit TDC, to the X-touch electrodes X-TE or deliver touch-sensing signal from the X-touch electrodes X-TE to the touch driving circuit TDC.

The arrangement of the X-touch routing lines X-TL and the Y-touch routing lines Y-TL may be modified variously depending on the design specification of the panel.

A touch protective film PAC may be disposed on the X-touch electrodes X-TE and the Y-touch electrodes Y-TE. The touch protective film PAC may extend to an area in front of or behind the dams DAM so as to be disposed on the X-touch routing lines X-TL and the Y-touch routing lines Y-TL.

The cross-sectional diagram of FIG. 9 is conceptual illustration of the structure. The positions, thicknesses, or widths of the patterns (e.g. various layers or electrodes) may vary depending on the direction or position of view, the structures for connecting the patterns may be modified, additional layers other than the plurality of illustrated layers may be further provided, and some of the plurality of illustrated layers may be omitted or integrated. For example, the width of the banks BANK may be narrower than that illustrated in the drawings, and the height of the dams DAM may be lower or higher than that illustrated in the drawings. In addition, the cross-sectional diagram of FIG. 9 illustrates a structure in which the touch electrode TE, the touch routing lines TL, and the like are disposed on the entirety of the subpixels SP in order to illustrate a structure connected to the touch pads TP along inclines of the touch routing lines TL and the encapsulation ENCAP. However, in a case in which the touch electrode TE or the like is mesh-shaped as described above, the open areas OA of the touch electrode TE may be located above the emitting areas of the subpixels SP. In addition, a color filter CF (shown in FIGS. 10 and 11) may be further disposed on the encapsulation ENCAP. The color filter CF may be located on the touch electrode TE or between the encapsulation ENCAP and the touch electrode TE.

Figure 10:
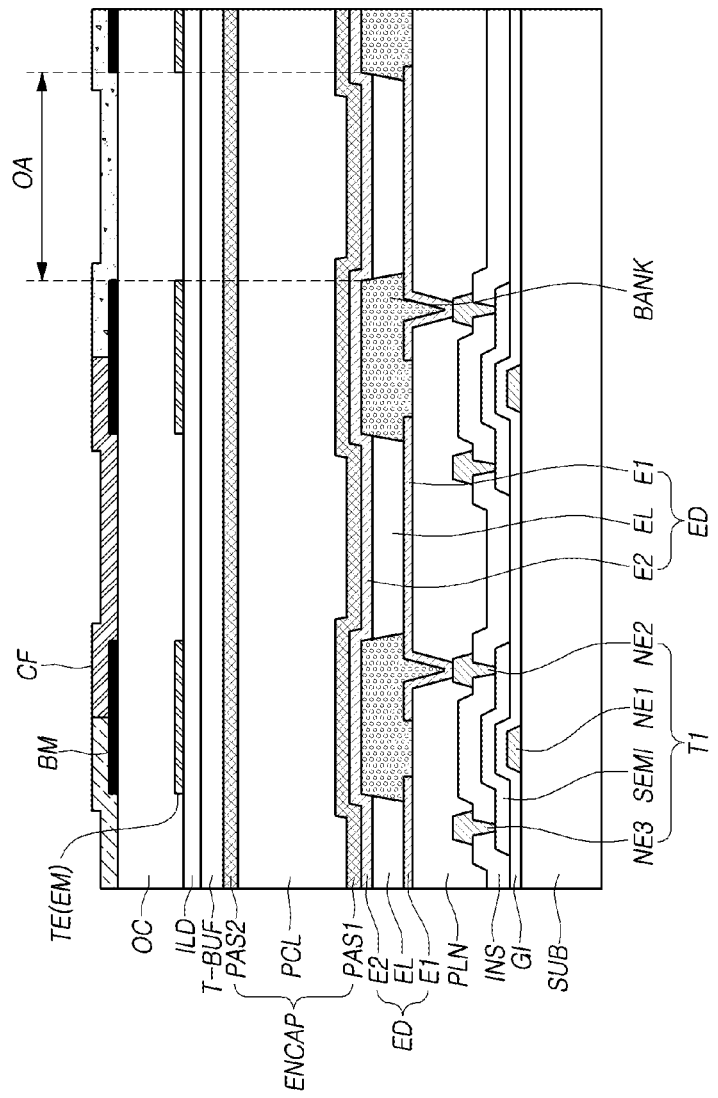
FIGS. 10 and 11 are diagrams illustrating a cross-sectional structure of the display panel including a color filter according to the present disclosure.
Figure 11:
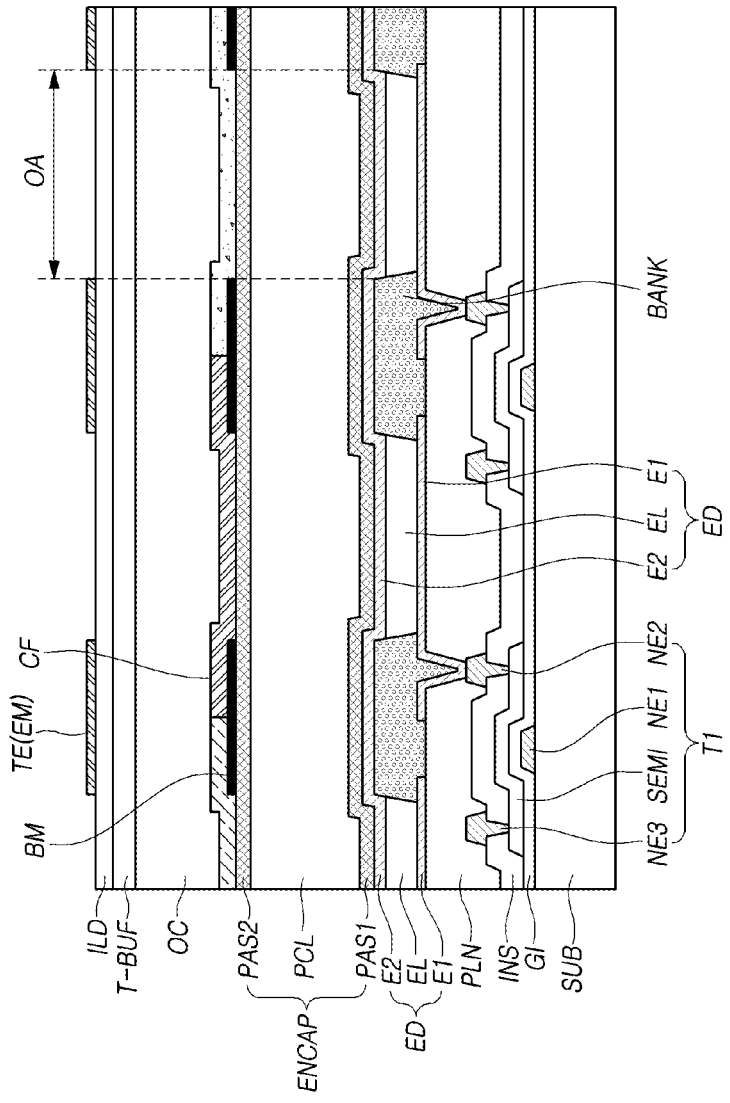

FIGS. 10 and 11 are diagrams illustrating a cross-sectional structure of the display panel DISP according to the present disclosure, including the color filter CF.

Referring to FIGS. 10 and 11, in a case in which the touch panel TSP is disposed within the display panel DISP and the display panel DISP is provided as an OLED display panel, the touch panel TSP may be located on the encapsulation ENCAP in the display panel DISP. That is, the touch sensor metals, such as the plurality of touch electrodes TE and the plurality of touch routing lines TL, may be located on the encapsulation ENCAP in the display panel DISP.

The touch electrode TE being provided on the encapsulation ENCAP as described above may form the touch electrode TE without significantly influencing the display performance or the formation of a display-related layer.

Referring to FIGS. 10 and 11, the second electrode E2 that may be the cathode of the OLED may be located below the encapsulation ENCAP.

The thickness T of the encapsulation ENCAP may be, for example, 1 µm or more.

Since the thickness of the encapsulation ENCAP is designed to be 1 µm or more as described above, parasitic capacitance generated between the second electrode E2 and the touch electrodes TE of the OLED may be reduced, thereby preventing touch sensitivity from being reduced by the parasitic capacitance.

As described above, each of the plurality of touch electrodes TE is patterned in the shape of a mesh, in which the electrode metal EM has two or more open areas OA. Each of the two or more open areas OA may correspond to one or more subpixels or the emitting areas thereof when viewed in a vertical direction.

As described above, the electrode metal EM of the touch electrode TE may be patterned such that the emitting area of one or more subpixels is provided in a position corresponding to each of the two or more open areas OA present in the area of the touch electrode TE when viewed in a plan view. Accordingly, the luminous efficiency of the display panel DISP may be improved.

As illustrated in FIGS. 10 and 11, a black matrix BM may be provided in the display panel DISP. The color filter CF may be further provided in the display panel DISP.

The position of the black matrix BM may correspond to the position of the electrode metal EM of the touch electrode TE.

The positions of the plurality of color filters CF correspond to the positions of the plurality of touch electrodes TE or the position of the electrode metal EM constituting the plurality of touch electrodes TE.

Since the plurality of color filters CF are located in positions corresponding to the plurality of open areas OA as described above, the luminous performance of the display panel DISP may be improved.

The vertical positional relationship between the plurality of color filters CF and the plurality of touch electrodes TE will be described as follows.

As illustrated in FIG. 10, the plurality of color filters CF and the black matrix BM may be located on the plurality of touch electrodes TE.

In this case, the plurality of color filters CF and the black matrix BM may be located on the overcoat layer OC disposed on the plurality of touch electrodes TE. Here, the overcoat layer OC may be the same layer as or a different layer from the touch protective film PAC illustrated in FIG. 9.

Alternatively, as illustrated in FIG. 11, the plurality of color filters CF and the black matrix BM may be located below the plurality of touch electrodes TE.

In this case, the plurality of touch electrodes TE may be located on the overcoat layer OC on the plurality of color filters CF and the black matrix BM. The overcoat layer OC may be the same layer as or a different layer from the touch buffer film T-BUF or the touch insulating film ILD illustrated in FIG. 9. Alternatively, the touch buffer film T-BUF or the touch insulating film ILD may be disposed in a manner separate from the overcoat layer OC.

Due to the vertical positional relationship between the touch electrode TE and a display driving configuration being adjusted as described above, a touch sensing configuration may be disposed without degrading the display performance.

In addition, according to various the present disclosure of the disclosure, to improve a performance of a touch sensing, in the mutual capacitance-based touch sensor structure, a method for performing the self-capacitance-based touch sensing and the mutual capacitance-based touch sensing may be provided.

Figure 12:
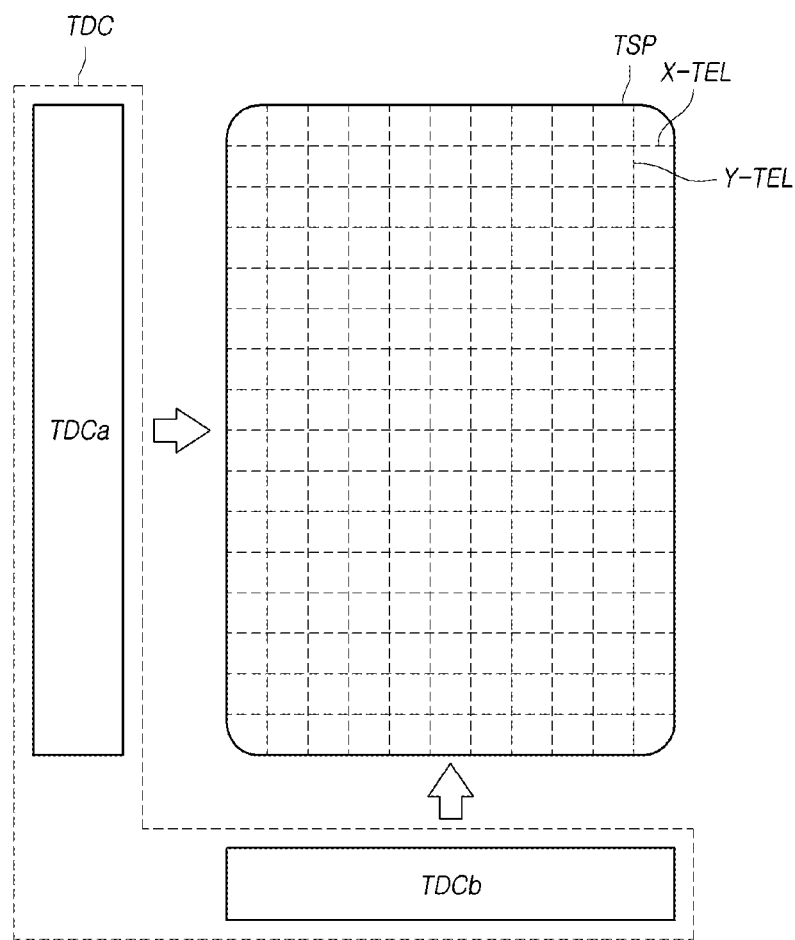
FIG. 12 is a diagram illustrating an example of a schematic configuration of the touch driving circuit to drive the touch panel according to the present disclosure.

FIG. 12 is a diagram illustrating an example of a schematic configuration of the touch driving circuit TDC to drive the touch panel TSP according to the present disclosure.

Referring to FIG. 12, the touch driving circuit TDC may comprise a first driving part TDCa driving the plurality of X-touch electrode lines X-TEL disposed in the touch panel TSP and a second driving part TDCb driving the plurality of Y-touch electrode lines Y-TEL.

The first driving part TDCa of the touch driving circuit TDC may output a touch driving signal to the plurality of X-touch electrode lines X-TEL. Furthermore, the first driving part TDCa may receive a touch sensing signal from the plurality of X-touch electrode lines X-TEL.

The second driving part TDCb of the touch driving circuit TDC may output a touch driving signal to the plurality of Y-touch electrode lines. Furthermore, the second driving part TDCb may receive a touch sensing signal from the plurality of Y-touch electrode lines Y-TEL.

The first driving part TDCa and the second driving part TDCb may perform the self-capacitance-based touch sensing or the mutual capacitance-based touch sensing according to a touch sensing mode.

In a case performing the self-capacitance-based sensing, the first driving part TDCa outputs the touch driving signal to the X-touch electrode line X-TEL and receives the touch sensing signal from the X-touch electrode line X-TEL. And the second driving part TDCb outputs the touch driving signal to the Y-touch electrode line Y-TEL and receives the touch sensing signal from the Y-touch electrode line Y-TEL in a period different from a period performing a touch sensing by the first driving part TDCa.

Since the X-touch electrode line X-TEL and the Y-touch electrode line Y-TEL are disposed crossing, a position where a touch is occurred may be sensed based on a touch position according to the touch sensing signal detected by the first driving part TDCa and a touch position according to the touch sensing signal detected by the second driving part TDCb.

When the self-capacitance-based touch sensing is performed, a variance of a capacitance according to a touch may be occurred largely. Thus, by performing the self-capacitance-based touch sensing in a touch sensor structure for the mutual capacitance-based touch sensing, a sensitivity of a touch sensing may be increased.

Furthermore, the first driving part TDCa and the second driving part TDCb may perform the mutual capacitance-based touch sensing.

In a case performing the mutual capacitance-based touch sensing, one of the X-touch electrode line X-TEL and the Y-touch electrode line Y-TEL may be the driving touch electrode line and the other may be the sensing touch electrode line.

For example, in a case that the X-touch electrode line X-TEL is the driving touch electrode line, the first driving part TDCa may output the touch driving signal to the plurality of X-touch electrode lines X-TEL. And the second driving part TDCb may receive the touch sensing signal from the plurality of Y-touch electrode lines Y-TEL.

That is, in a state that voltages having a potential difference are applied to the X-touch electrode line X-TEL and the Y-touch electrode line Y-TEL, a variance of a mutual capacitance between the X-touch electrode line X-TEL and the Y-touch electrode line Y-TEL occurred by a touch may be sensed and thus a touch may be detected. Here, the Y-touch electrode line Y-TEL may be a state that a constant voltage is applied in a period performing the mutual capacitance-based touch sensing.

As performing the mutual capacitance-based touch sensing, a touch sensing may be performed while reducing a noise of the touch sensing signal.

Figure 13:
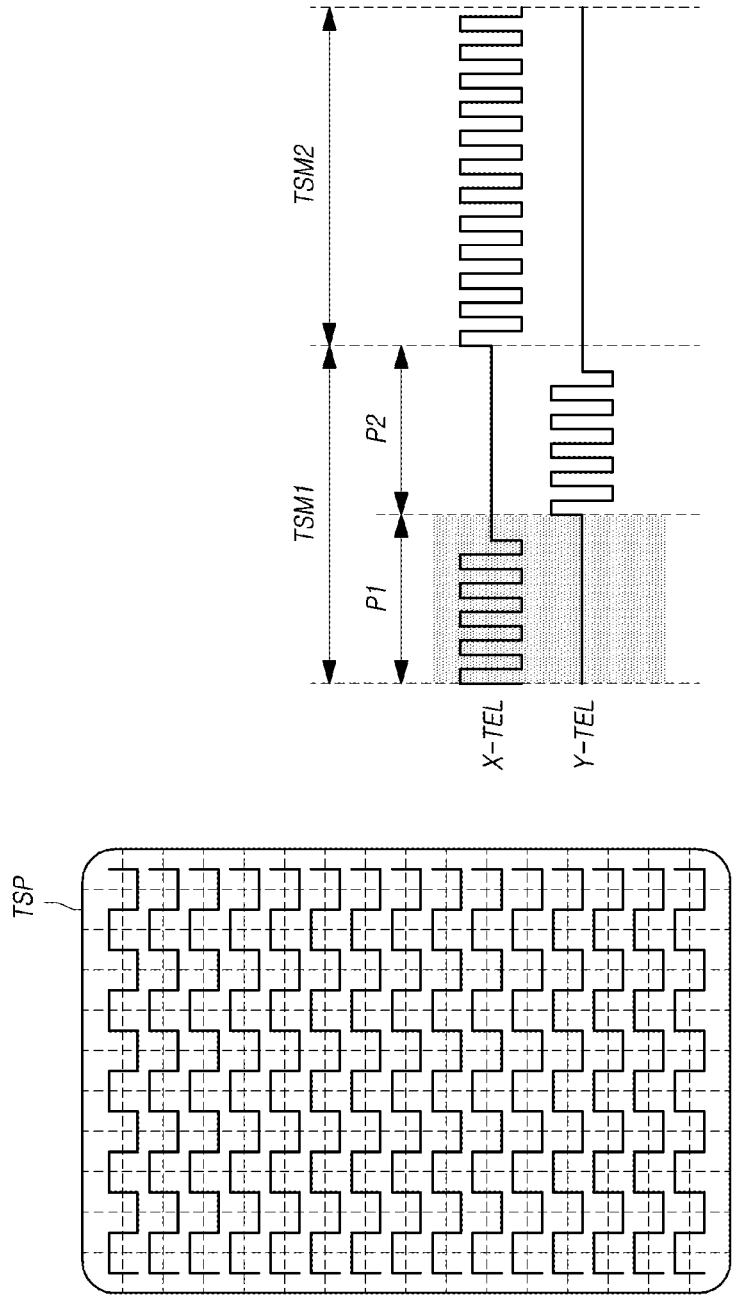

FIGS. 13 and 14 are diagrams illustrating an example of a method for the touch driving circuit TDC to perform a touch sensing in the touch panel TSP according to the present disclosure.

Referring to FIGS. 13 and 14, the touch driving circuit TDC may be driven as a first touch sensing mode TSM1 and a second touch sensing mode TSM2 in timely divided periods.

Here, the first touch sensing mode TSM1 is a mode performing the self-capacitance-based touch sensing, and the second touch sensing mode TSM2 is a mode performing the mutual capacitance-based touch sensing.

The touch driving circuit TDC, for example, may perform a touch sensing as the first touch sensing mode TSM1 before performing a touch sensing as the second touch sensing mode TSM2.

For example, as an example illustrated in FIG. 13, the touch driving signal may be supplied to the plurality of X-touch electrode lines X-TEL disposed in the touch panel TSP in a first period P1 of the first touch sensing mode TSM1. And the first driving part TDCa may perform the self-capacitance-based touch sensing by detecting the touch sensing signal from the X-touch electrode line X-TEL which the touch driving signal is applied.

And, as an example illustrate in FIG. 14, the touch driving signal may be supplied to the plurality Y-touch electrode lines Y-TEL disposed in the touch panel TSP in a second period P2 of the first touch sensing mode TSM1. And the second driving part TDCb my perform the self-capacitance-based touch sensing by detecting the touch sensing signal from the Y-touch electrode line Y-TEL which the touch driving signal is applied.

Accordingly, the touch driving circuit TDC may transmit a touch sensing data based on the touch sensing signal detected in the first period P1 and a touch sensing data based on the touch sensing signal detected in the second period P2. The touch controller TCTR may detect a touch of a user and a touch position based on a sensing result of the first period P1 and a sensing result of the second period P2.

A touch sensing as the second touch sensing mode TSM2 may be performed after performing a touch sensing as the first touch sensing mode TSM1.

A period for driving as the first touch sensing mode TSM1 and the second touch sensing mode TSM2 may be various.

For example, driving as the first touch sensing mode TSM1 until detecting an initial touch sensing, and the touch driving circuit TDC may be driven as the second touch sensing mode TSM2 after detecting a touch sensing. That is, the touch driving circuit TDC may be driven as the first touch sensing mode TSM1 in a period which a high touch sensitivity is required, and may be driven as the second touch sensing mode TSM2 after detecting an initial touch for reducing an influence by a noise and providing a touch stability.

Alternatively, besides examples above-mentioned, according to a control of the touch controller TCTR, the touch driving circuit TDC may perform the self-capacitance-based touch sensing and the mutual capacitance-based touch sensing in various manners.

As described above, according to various the present disclosure of the disclosure, in a touch sensor structure performing the mutual capacitance-based touch sensing, by performing the self-capacitance-based touch sensing and the mutual capacitance-based touch sensing, a performance of a touch sensing may be improved.

Furthermore, according to various the present disclosure of the disclosure, by driving at least one touch electrode line of the X-touch electrode line X-TEL and the Y-touch electrode line Y-TEL as divided in a period performing the self-capacitance-based touch sensing, a noise according to a display driving may be reduced in a period performing the self-capacitance-based touch sensing.

Figure 15:
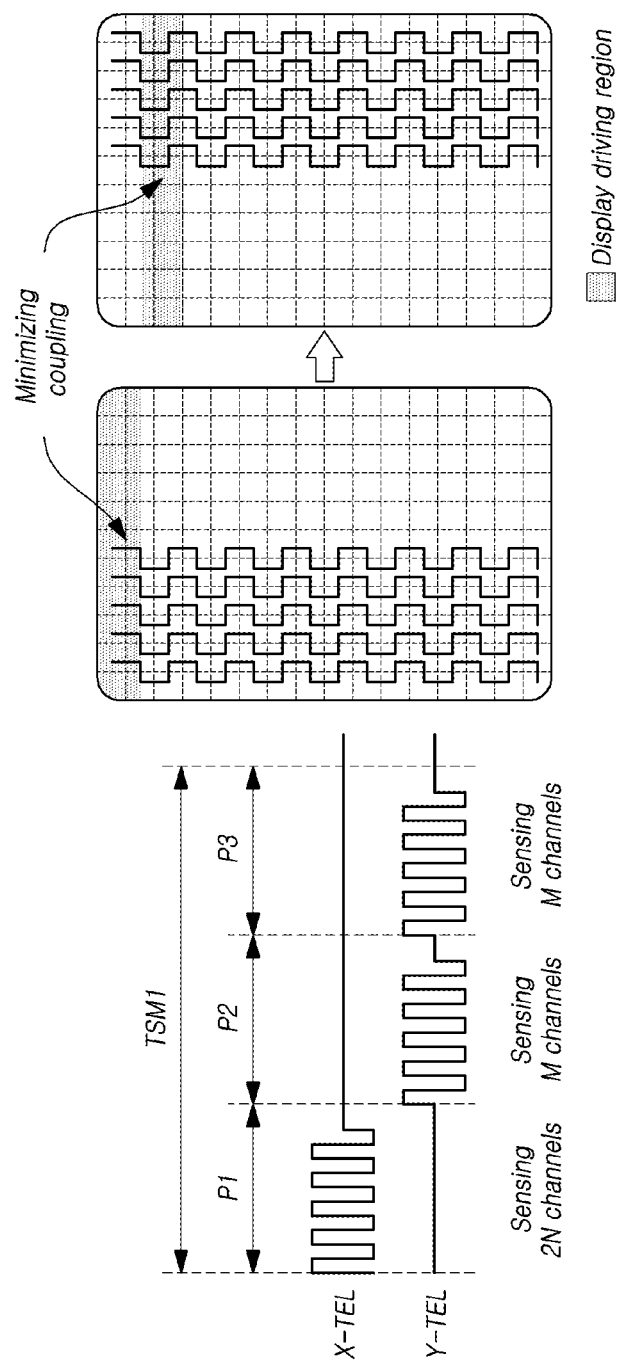
FIGS. 15, 16 and 17 are diagrams illustrating other example of a method for the touch driving circuit to perform a touch sensing in the touch panel according to the present disclosure.
Figure 16:
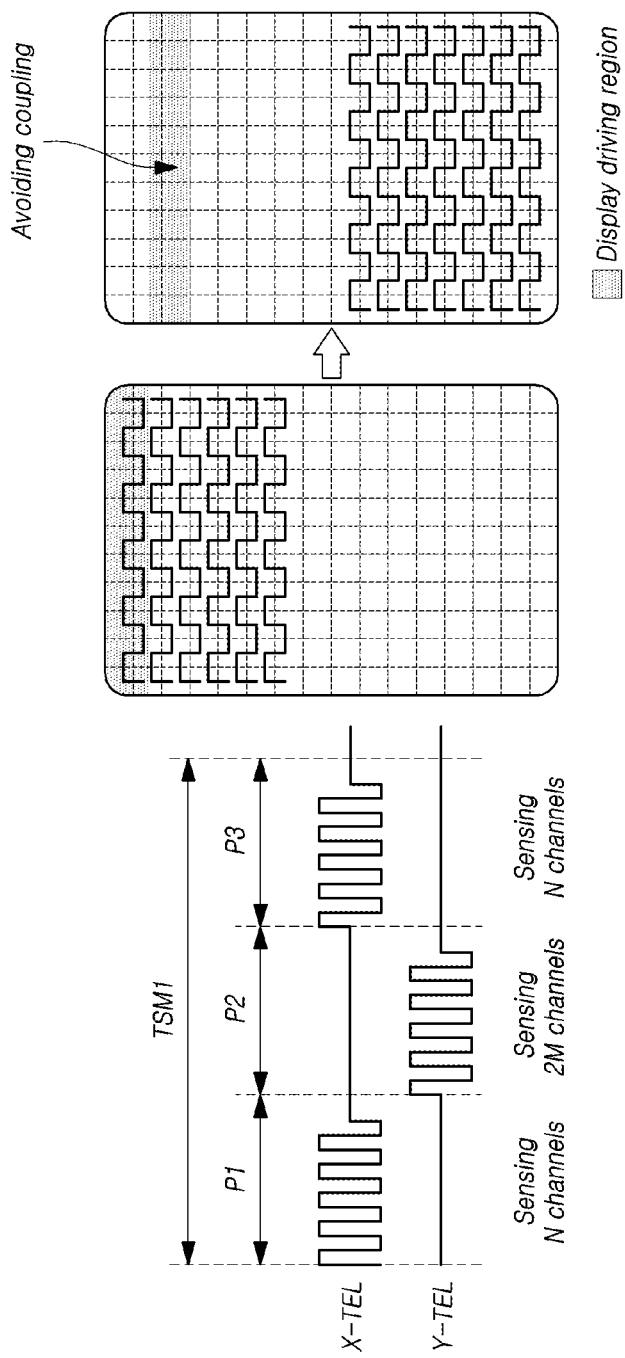
Figure 17:
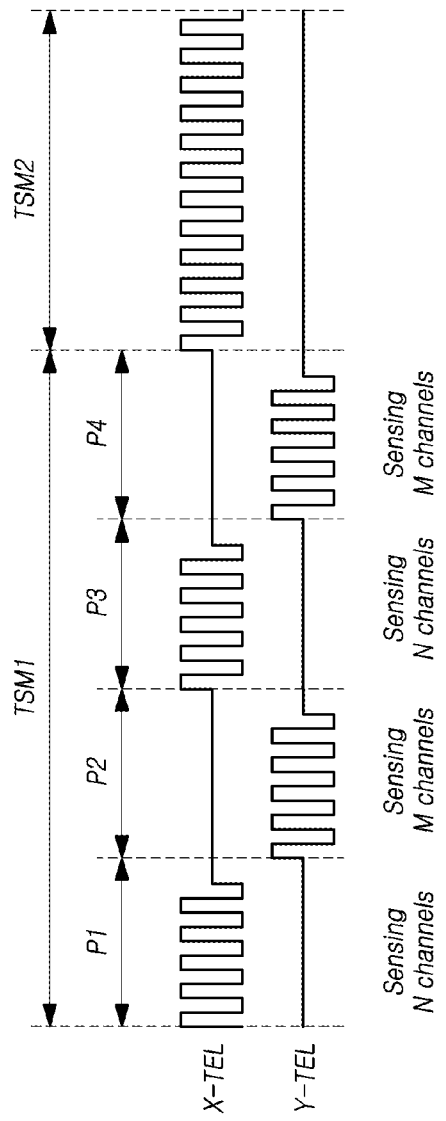

FIGS. 15, 16 and 17 are diagrams illustrating other example of a method for the touch driving circuit TDC to perform a touch sensing in the touch panel TSP according to the present disclosure.

FIG. 15 illustrates an example driving the Y-touch electrode line Y-TEL as divided, and FIG. 16 illustrates an example driving the X-touch electrode line X-TEL as divided. And FIG. 17 illustrates an example driving all of the X-touch electrode line X-TEL and the Y-touch electrode line Y-TEL as divided.

Referring to FIG. 15, the touch driving circuit TDC may output the touch driving signal to at least one of the plurality of X-touch electrode lines X-TEL in a first period P1 of the first touch sensing mode TSM1.

For example, the touch driving circuit TDC may output the touch driving signal to all of the plurality of X-touch electrode lines X-TEL. In a case that the number of the X-touch electrode line X-TEL is 2N, that is, in a case that the number of channels driving the X-touch electrode line X-TEL is 2N, 2N channels may be driven simultaneously and a touch sensing may be performed.

The touch driving circuit TDC may output the touch driving signal to the Y-touch electrode line Y-TEL included in a first group of the plurality of Y-touch electrode lines Y-TEL and may perform a touch sensing in a second period P2 of the first touch sensing mode TSM1. And the touch driving circuit TDC may output the touch driving signal to the Y-touch electrode line Y-TEL included in a second group of the plurality of the Y-touch electrode line Y-TEL and may receive the touch sensing signal in a third period P3 of the first touch sensing mode TSM1.

Here, the Y-touch electrode line Y-TEL of the first group and the Y-touch electrode line Y-TEL of the second group may be different Y-touch electrode line Y-TEL each other. And the number of the Y-touch electrode line Y-TEL of the first group and the number of the Y-touch electrode line Y-TEL of the second group may be same, or different.

For example, the Y-touch electrode line Y-TEL corresponding to ½ of all of the plurality of Y-touch electrode lines Y-TEL may be included in the first group, and the Y-touch electrode line Y-TEL corresponding to remaining ½ may be included in the second group.

In a case that the number of the Y-touch electrode line Y-TEL is 2M, that is, in a case that the number of channels driving the Y-touch electrode line Y-TEL is 2M, M channels may be driven and a touch sensing may be performed in the second period P2, and remaining M channels may be driven and a touch sensing may be performed in the third period P3.

That is, in a period performing the self-capacitance-based touch sensing while driving the Y-touch electrode line Y-TEL, a sensing to the plurality of Y-touch electrode lines Y-TEL may be performed in a timely divided period.

Thus, the number of channels being driven for a touch sensing in each period may be reduced.

For example, as an example illustrated in FIG. 15, a sensing may be performed through 2N channels in the first period P1, a sensing may be performed through M channels in the second period P2, and a sensing may be performed through M channels in the third period P3.

Here, for example, 2M may be greater than 2N. That is, by driving a part having more channels as divided, the number of channels being driven in each period may be reduced.

Performing the self-capacitance-based touch sensing in the first touch sensing mode TSM1, as reducing the number of channels being driven in each period, a noise of a touch sensing by a display driving performed simultaneously with the touch sensing may be reduced.

Furthermore, as reducing a portion which a display driving region and a region where a touch sensing is performed are overlapped, a coupling between the touch electrode line which the touch driving signal is supplied and a signal line which a signal for a display driving is applied may be minimized and a noise of a touch sensing may be reduced.

The number of channels of the Y-touch electrode line Y-TEL which is driven as divided may be configured differently, also a period driving the Y-touch electrode line Y-TEL being driven as divided may be configured differently.

For example, FIG. 15 illustrates an example performing a sensing by the Y-touch electrode line Y-TEL after performing a sensing by the X-touch electrode line X-TEL, but the first period P1 may be between the second period P2 and the third period P3, or the first period P1 may be after the second period P2 and the third period P3.

Merely, since a touch recognition could be performed after performing a sensing for all of the X-touch electrode line X-TEL and a sensing for all of the Y-touch electrode line Y-TEL, even though the channels are driven as divided, a sensing for all channels of the X-touch electrode line X-TEL and the Y-touch electrode line Y-TEL may be performed in one sensing unit period (e.g., P1+P2+P3).

Furthermore, the touch driving circuit TDC may drive the channels of the plurality of X-touch electrode lines X-TEL as divided in the first touch sensing mode TSM1.

Referring to FIG. 16, the touch driving circuit TDC may output the touch driving signal to the X-touch electrode line X-TEL included in a first group of the plurality of X-touch electrode lines X-TEL in a first period of the first touch sensing mode TSM1.

For example, the touch driving circuit TDC, in a case that the number of channels driving the plurality of X-touch electrode lines X-TEL is 2N, may output the touch driving signal to X-touch electrode line X-TEL by driving N channels. And the touch driving circuit TDC may receive the touch sensing signal through N channels.

The touch driving circuit TDC may output the touch driving signal to the plurality of Y-touch electrode lines Y-TEL in a second period P2 of the first touch sensing mode TSM1.

For example, the touch driving circuit TDC, in a case that the number of channels driving the plurality of Y-touch electrode lines Y-TEL is 2M, may output the touch driving signal to Y-touch electrode line Y-TEL by driving 2M channels. And the touch driving circuit TDC may receive the touch sensing signal through 2M channels.

And the touch driving circuit TDC may output the touch driving signal to the X-touch electrode line X-TEL included in a second group of the plurality of X-touch electrode lines X-TEL in a third period P3 of the first touch sensing mode TSM1.

The touch driving circuit TDC may drive N channels in the third period P3 and may receive the touch sensing signal from the X-touch electrode line X-TEL. Here, N channels being driven in the third period P3 may be different channels from N channels being driven in the first period P1.

That is, a touch sensing may be performed by driving the plurality of X-touch electrode lines X-TEL as divided in the first period P1 and the third period P3, a touch sensing may be performed by driving the plurality of Y-touch electrode lines Y-TEL in the second period P2.

Here, for example, 2N may be greater than 2M. Thus, by driving a part having more channels as divided, the number of channels being driven in each period of the first touch sensing mode TSM1 may be reduced and a noise of the touch sensing signal performed simultaneously with a display driving may be reduced.

Furthermore, in a case driving the plurality of X-touch electrode line X-TEL as divided, a region where the touch driving signal is supplied and a region where a signal for display driving is supplied may not be overlapped according to each period. Thus, avoiding a coupling between the touch electrode and a signal line for a display driving or the like, a noise of the touch sensing signal may be reduced.

And an example illustrated in FIG. 16 illustrates an example driving the Y-touch electrode line Y-TEL between periods driving the X-touch electrode line X-TEL as divided, but as described above, a period that the Y-touch electrode line Y-TEL is driving may be various.

That is, the second period P2 driving the plurality of Y-touch electrode lines Y-TEL, in some cases, may be before the first period P1, or after the third period P3.

As described above, according to various the present disclosure of the disclosure, in a touch sensor structure performing the mutual capacitance-based touch sensing, by driving the X-touch electrode line X-TEL or the Y-touch electrode line Y-TEL as divided in a period when the self-capacitance-based touch sensing is performed, a method for performing the self-capacitance-based touch sensing may be provided while reducing a noise of the touch sensing signal.

Furthermore, according to types of the touch display device, in a case that the number of channels is large, channels for driving the X-touch electrode line X-TEL and the Y-touch electrode line Y-TEL may be driven as divided in all.

Referring to FIG. 17, the touch driving circuit TDC may drive the plurality of X-touch electrode line X-TEL and the plurality of Y-touch electrode line Y-TEL by dividing channels in all.

Here, FIG. 17 illustrates an example that the plurality of X-touch electrode lines X-TEL are driven by 2N channels and the plurality of Y-touch electrode lines Y-TEL are driven by 2M channels.

The touch driving circuit TDC may drive N channels in a first period P1 of the first touch sensing mode TSM1 and may perform a sensing to N X-touch electrode line X-TEL of the plurality of X-touch electrode lines X-TEL.

The touch driving circuit TDC may drive M channels in a second period P2 and may perform a sensing to M Y-touch electrode line Y-TEL of the plurality of Y-touch electrode line Y-TEL.

The touch driving circuit TDC may drive different N channels from N channels being driven in the first period P1 in a third period P3 and may perform a sensing to remaining X-touch electrode line X-TEL.

And the touch driving circuit TDC may drive different M channels from M channels being driven in the second period P2 in a fourth period P4 and may perform a sensing to remaining Y-touch electrode line Y-TEL.

Here, an order of the first period P1 to the fourth period P4 is only an example, as above-mentioned, the order of the first period P1 to the fourth period P4 may be changed.

As described above, as the touch driving circuit TDC may drive the X-touch electrode line X-TEL and the Y-touch electrode line Y-TEL by dividing channels in all, the number of channels being driven in each period of the first touch sensing mode TSM1 may be reduced and a noise of the touch sensing signal may be reduced.

Furthermore, according to types of the touch display device, a part that the number of channels is more may be driven as divided in periods more than three, and a part that the number of channels is less may be driven simultaneously.

For example, the plurality of X-touch electrode lines X-TEL may be driven as divided in three periods and the number of channels being driven in each period may be reduced. And the plurality of Y-touch electrode lines Y-TEL may be driven simultaneously and an increase of a sensing time according to driving channels as divided may be minimized.

That is, according to various the present disclosure of the disclosure, at least one of the X-touch electrode line X-TEL and the Y-touch electrode line Y-TEL may be driven by driving channels as divided, and a method for driving channels as divided may be configured variously according to the number of channels driving the X-touch electrode line X-TEL and the number of channels driving the Y-touch electrode line Y-TEL.

Figure 18:
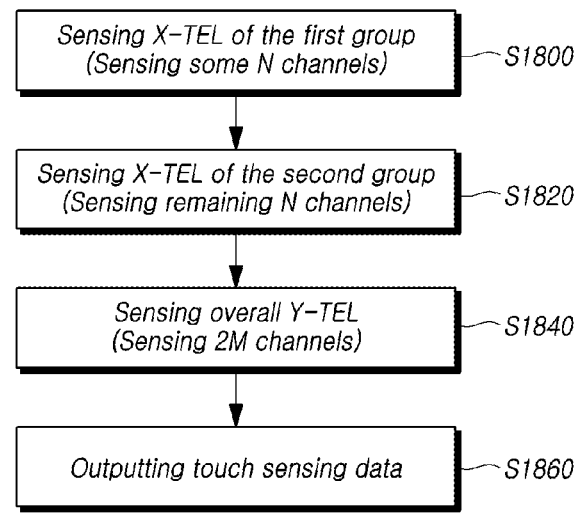
FIG. 18 is a diagram illustrating an example of a process of a method for driving of the touch driving circuit according to the present disclosure.

FIG. 18 is a diagram illustrating an example of a process of a method for driving of the touch driving circuit TDC according to the present disclosure.

Referring to FIG. 18, the touch driving circuit TDC performs a sensing to the X-touch electrode line X-TEL included in a first group in a period performing the self-capacitance-based touch sensing S1800. And the touch driving circuit TDC performs a touch sensing to the X-touch electrode line X-TEL included in a second group different from the first group S1820.

The touch driving circuit TDC may perform a sensing to the Y-touch electrode line Y-TEL, and may perform a sensing to all Y-touch electrode lines Y-TEL simultaneously S1840.

The touch driving circuit TDC may output a touch sensing data according to a sensing to the X-touch electrode line X-TEL performed in two periods and a touch sensing data according to a sensing to the Y-touch electrode line Y-TEL performed in one period S1860.

According to various the present disclosure of the disclosure, in a touch sensor structure performing the mutual capacitance-based touch sensing, by performing the self-capacitance-based touch sensing and the mutual capacitance-based touch sensing, a method for increasing a sensitivity and an accuracy of a touch sensing may be provided.

Furthermore, in a period which the self-capacitance-based touch sensing is performed, by driving at least one of the X-touch electrode line X-TEL and the Y-touch electrode line Y-TEL as divided, a noise according to a display driving may be reduced and a performance of a touch sensing may be improved when the self-capacitance-based touch sensing is performed.

The above description has been presented to enable any person skilled in the art to make and use the technical idea of the present disclosure, and has been provided in the context of a particular application and its requirements. Various modifications, additions and substitutions to the described the present disclosure will be readily apparent to those skilled in the art, and the general principles defined herein may be applied to other the present disclosure and applications without departing from the spirit and scope of the present disclosure. The above description and the accompanying drawings provide an example of the technical idea of the present disclosure for illustrative purposes only. That is, the disclosed the present disclosure are intended to illustrate the scope of the technical idea of the present disclosure. Thus, the scope of the present disclosure is not limited to the present disclosure shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device comprising:
    a panel on which a plurality of gate lines, a plurality of data lines and a plurality of subpixels are disposed;
    a plurality of emitting devices disposed at the plurality of subpixels;
    an encapsulation disposed on each emitting device;
    a plurality of touch electrode lines disposed on the encapsulation and including at least one touch electrode; and
    a touch driving circuit configured to drive the touch electrode lines,
    wherein the plurality of touch electrode lines comprises:
    a plurality of X-touch electrode lines disposed in a first direction; and
    a plurality of Y-touch electrode lines disposed in a second direction which is different from the first direction,
    wherein the touch driving circuit is configured to:
    output a touch driving signal to X-touch electrode lines of a first group of the plurality of X-touch electrode lines during a first period of a first touch sensing mode,
    output the touch driving signal to X-touch electrode lines of a second group of the plurality of X-touch electrode lines during a second period of the first touch sensing mode, and
    output the touch driving signal to at least one Y-touch electrode line of the plurality of Y-touch electrode lines during a third period of the first touch sensing mode.

2. The touch display device of claim 1, wherein the number of X-touch electrode lines is greater than the number of Y-touch electrode lines.

3. The touch display device of claim 1, wherein the X-touch electrode lines of the first group is a portion of X-touch electrode lines of the plurality of X-touch electrode lines, and the X-touch electrode lines of the second group is a remaining portion of X-touch electrode lines except for the X-touch electrode lines of the first group of the plurality of X-touch electrode lines.

4. The touch display device of claim 3, wherein the number of the X-touch electrode lines of the first group is equal to the number of the X-touch electrode lines of the second group.

5. The touch display device of claim 1, wherein the touch driving signal is supplied to all of the Y-touch electrode lines of the plurality of Y-touch electrode lines in the third period of the first touch sensing mode.

6. The touch display device of claim 1, wherein the touch driving signal is supplied to a portion of Y-touch electrode lines of the plurality of Y-touch electrode lines in the third period of the first touch sensing mode, and the touch driving signal is supplied to a remaining portion of Y-touch electrode lines of the plurality of Y-touch electrode lines in a fourth period of the first touch sensing mode.

7. The touch display device of claim 1, wherein the third period is between the first period and the second period.

8. The touch display device of claim 1, wherein the third period is before the first period and the second period, or is after the first period and the second period.

9. The touch display device of claim 1, wherein, in a second touch sensing mode after the first touch sensing mode,
    the touch driving signal is supplied to the X-touch electrode lines and a constant voltage is supplied to the Y-touch electrode lines, or the touch driving signal is supplied to the Y-touch electrode lines and a constant voltage is supplied to the X-touch electrode lines.

10. The touch display device of claim 9, wherein the first touch sensing mode is a self-capacitance sensing mode, and the second touch sensing mode is a mutual-capacitance sensing mode.

11. The touch display device of claim 1, wherein at least one data line of the plurality of data lines receives a data voltage during at least a partial period of the first touch sensing mode.

12. The touch display device of claim 1, wherein the touch electrode included in the touch electrode line is a mesh type having at least one opening, and at least a part of the touch electrode overlaps with the plurality of data lines.

* * * * *